(12) United States Patent
Gallina et al.

(10) Patent No.: US 9,606,589 B2
(45) Date of Patent: Mar. 28, 2017

(54) EXPANSION CARD HAVING SYNERGISTIC COOLING, STRUCTURAL AND VOLUME REDUCTION SOLUTIONS

(75) Inventors: Mark J. Gallina, Hillsboro, OR (US); Jason B. Chesser, Beaverton, OR (US); Mike G. Macgregor, Portland, OR (US); Mark J. Luckeroth, Portland, OR (US); Brian S. Jarrett, Hillsboro, OR (US); Thu Huynh, Hillsboro, OR (US); Eric D. Mcafee, Portland, OR (US); Barrett M. Faneuf, Beaverton, OR (US); Michelle Goeppinger, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 13/997,758

(22) PCT Filed: Nov. 29, 2011

(86) PCT No.: PCT/US2011/062447
§ 371 (c)(1),
(2), (4) Date: Jul. 11, 2014

(87) PCT Pub. No.: WO2013/081585
PCT Pub. Date: Jun. 6, 2013

(65) Prior Publication Data
US 2015/0234437 A1    Aug. 20, 2015

(51) Int. Cl.
*G06F 1/20* (2006.01)
*G06F 1/18* (2006.01)
*H05K 7/20* (2006.01)

(52) U.S. Cl.
CPC .............. *G06F 1/20* (2013.01); *G06F 1/185* (2013.01); *H05K 7/20145* (2013.01); *H05K 7/20336* (2013.01)

(58) Field of Classification Search
CPC ..... H01L 2924/15311; H01L 2924/181; H01L 2924/1434; G06F 1/185; G06F 1/18;
(Continued)

(56) References Cited

U.S. PATENT DOCUMENTS 5,338,214 A    8/1994  Steffes et al.
5,526,229 A *  6/1996  Wakabayashi ........... B41J 29/00
                                                    361/690

(Continued)

FOREIGN PATENT DOCUMENTS

TW    M243706 U     9/2004
TW    M267511 U     6/2005
WO    2013/081585 A1  6/2013

OTHER PUBLICATIONS

International Preliminary Report on Patentability and Written Opinion received for PCT Patent Application No. PCT/US2011/062447, mailed on Jun. 12, 2014, 6 pages.
(Continued)

*Primary Examiner* — Courtney Smith
*Assistant Examiner* — Michael Matey
(74) *Attorney, Agent, or Firm* — Jordan IP Law, LLC

(57) ABSTRACT

Systems and methods of fabricating circuit board assemblies may provide for a circuit board assembly that includes an expansion card having a first side and a second side, a first set of semiconductor packages coupled to the first side and a second set of semiconductor packages coupled to the second side. The circuit board assembly may also include a synergistic combination of cooling solutions for the expansion card such as a metallic duct, centrifugal fan or secondary plate, structural solutions for the expansion card such as a clamp structure or retention interlock, and volume reduction solutions for the expansion card such as one or more flipped power connectors.

25 Claims, 22 Drawing Sheets

(58) Field of Classification Search
CPC . G06F 1/186; G06F 1/20; G06F 1/181; G06F 1/16; G06F 1/1632; G06F 1/183; G06F 1/1656; G06F 1/187; G06F 1/188; G06F 1/1626; G06F 1/1658; G06F 1/184; G06F 13/4068; H05K 2201/10159; H05K 7/1489; H05K 5/0247; H05K 7/20145; H05K 2201/10446; H05K 5/0004; H05K 7/02; H05K 7/1427; H05K 2201/10545
USPC .............................. 361/679.32, 694, 679.41
See application file for complete search history.

(56) References Cited

U.S. PATENT DOCUMENTS

| | | | | |
|---|---|---|---|---|
| 5,910,884 | A * | 6/1999 | Garza | G06F 1/20 165/80.3 |
| 6,028,771 | A * | 2/2000 | Wong | H05K 5/0013 361/704 |
| 6,208,514 | B1 * | 3/2001 | Stark | H05K 7/1431 174/359 |
| 6,585,534 | B2 | 7/2003 | Llapitan | H01L 23/4093 257/E23.086 |
| 7,002,797 | B1 * | 2/2006 | Wittig | H05K 7/20154 165/80.3 |
| 7,283,364 | B2 * | 10/2007 | Refai-Ahmed | G06F 1/20 165/185 |
| 7,321,494 | B2 * | 1/2008 | Han | G06F 1/20 165/185 |
| 7,365,989 | B2 * | 4/2008 | Peng | G06F 1/20 165/104.33 |
| 7,382,621 | B2 * | 6/2008 | Peng | H01L 23/427 165/121 |
| 7,453,706 | B2 * | 11/2008 | Clark | H04Q 1/03 361/790 |
| 7,782,617 | B2 * | 8/2010 | Li | G06F 1/20 165/104.33 |
| 7,787,247 | B2 * | 8/2010 | Han | G06F 1/20 165/104.33 |
| 7,885,073 | B2 * | 2/2011 | Peng | H01L 23/427 165/104.33 |
| 2005/0061477 | A1 * | 3/2005 | Mira | F04D 29/582 165/80.3 |
| 2008/0046617 | A1 | 2/2008 | Lee et al. | |
| 2008/0074839 | A1 * | 3/2008 | Tamaki | G06F 1/20 361/679.46 |
| 2009/0262497 | A1 | 10/2009 | Beauchamp et al. | |
| 2010/0155489 | A1 * | 6/2010 | Chang | G06K 19/07743 235/486 |
| 2011/0096500 | A1 | 4/2011 | Zhang et al. | |
| 2011/0279969 | A1 * | 11/2011 | Memon | G06F 1/20 361/679.47 |
| 2014/0240930 | A1 * | 8/2014 | Arvelo | H05K 7/2039 361/721 |

OTHER PUBLICATIONS

International Search Report and Written Opinion received for PCT application No. PCT/US2011/062447, mailed on Sep. 3, 2012, 9 pages.

Hilbert Hagedoorn, "Arctic Accelero Xtreme 2900 VGA cooler review", Jan. 9, 2008, Retrieved from <guru3d.com/articles-pages/arctic-accelero-xtreme-2900-vag-cooler-review,1.html>, 27 pages.

* cited by examiner

US 9,606,589 B2

EXPANSION CARD HAVING SYNERGISTIC COOLING, STRUCTURAL AND VOLUME REDUCTION SOLUTIONS

BACKGROUND

Technical Field

Embodiments generally relate to expansion cards. More particularly, embodiments relate to expansion card configurations that have synergistic cooling, structural and volume reduction solutions.

Discussion

Expansion cards such as graphics cards and throughput cards may be used to expand the computing power of systems, wherein a typical expansion card may be connected to a mother board of a system via a PHI-e (Peripheral Components Interconnect Express, e.g., PHI Express x16 Graphics 150W-TAX Specification 1.0, PHI Special Interest Group) connector mounted to the mother board. As the computing power of certain expansion cards may increase, the addition of heat sinks and other cooling solutions to the cards may be needed in order dissipate heat generated by card components. Certain cooling solutions, however, may be relatively large and heavy, which can lead to concerns with regard to shock resistance (e.g., if the system is dropped during shipment). Moreover, trends toward smaller computing systems may limit the amount of available volume to be dedicated to cooling solutions.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Figure 1A:
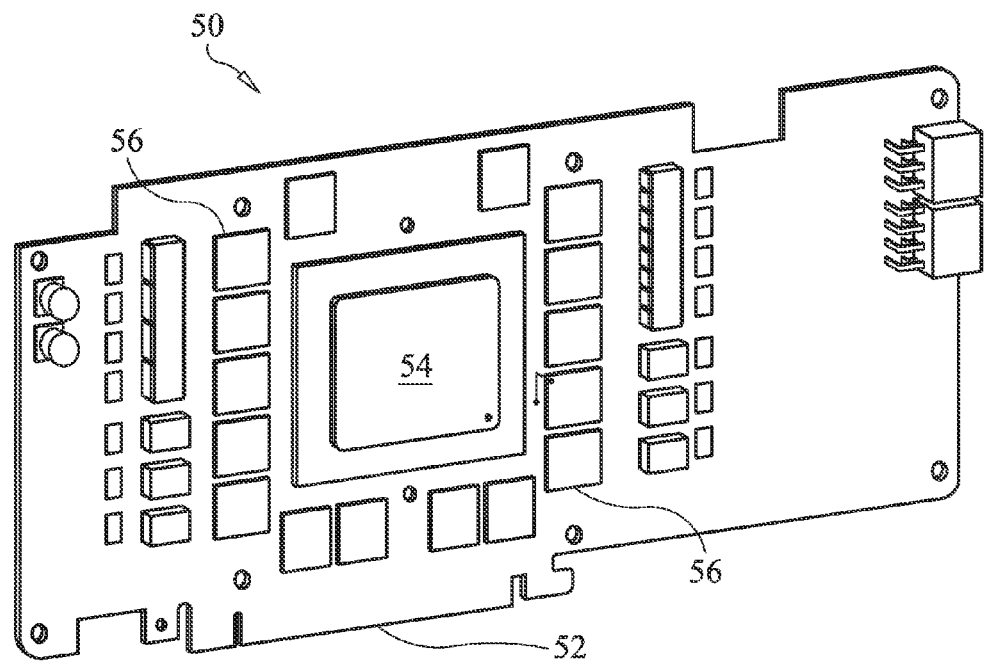
FIG. 1A is a perspective view of an example a front side of an expansion card according to an embodiment.

Embodiments may include a circuit board assembly having an expansion card with a first side and a second side, and a first set of semiconductor packages coupled to the first side of the expansion card. The circuit board assembly can also include a metallic duct coupled to the first side of the expansion card. The metallic duct may include one or more flange surfaces having a direct thermal connection with one or more of the first set of semiconductor packages.

Embodiments may also include a circuit board assembly having an expansion card with a first side and a second side, and a first set of semiconductor packages coupled to the first side of the expansion card. A primary clamp structure may be coupled to the first side of the expansion card, and a secondary clamp structure may be coupled to the second side of the expansion card. The primary clamp structure can include a front edge surface that contacts a peripheral portion of the first side of the expansion card and clamps the expansion card between the secondary clamp structure and the primary clamp structure.

In addition, embodiments can include a circuit board assembly having an expansion card with a first side and a second side. A first set of semiconductor packages may be coupled to the first side of the expansion card, and a second set of semiconductor packages may be coupled to the second side of the expansion card. The circuit board assembly can also include a first heat pipe coupled to the first side of the expansion card, and a secondary plate coupled to the second side of the expansion card, wherein the secondary plate has a direct thermal connection with one or more of the second set of semiconductor packages. The circuit board assembly may also include a second heat pipe coupled to the second side of the expansion card, wherein the second heat pipe has a direct thermal connection with the secondary plate. Moreover, the expansion card can include surfaces defining a pipe opening, wherein the first and second heat pipes contact one another through the pipe opening.

Other embodiments may include a circuit board assembly having an expansion card with a first side and a second side, and a centrifugal fan coupled to the first side of the expansion card. The centrifugal fan can include an impeller wheel having a plurality of blades, wherein each blade of the centrifugal fan includes one or more curved in board edges that have an inner radius of approximately 25 mm.

Additionally, embodiments may include a circuit board assembly having an expansion card is with a first side and a second side, and a power connector coupled to the first side of the expansion card adjacent to an edge of the expansion card. The power connector can include a plug retention mechanism disposed on the second side of the expansion card.

Embodiments may also include a circuit board assembly having an expansion card and a card bracket coupled to the expansion card, wherein the card bracket includes surfaces defining a longitudinal opening and surfaces defining a lateral opening. The circuit board assembly may also include an interlock disposed within the card bracket, wherein the interlock has a first member extending through the longitudinal opening and a second member extending through the lateral opening. A number of these embodiments may be combined with one another to achieve synergistic effects with regard to cooling, shock absorption and volume reduction.

Figure 1B:
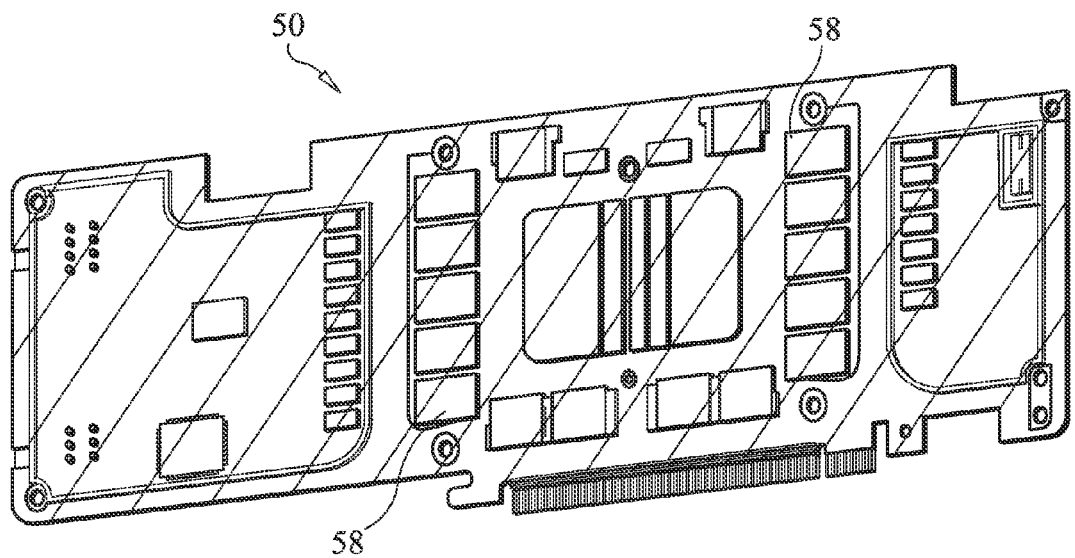
FIG. 1B is a perspective view of an example of a back side of an expansion card according to an embodiment.

Turning now to FIGS. 1A and 1B, front and back views of an expansion card 50 are shown, respectively. In general, the expansion card 50 might be used to perform, for example, processing intensive graphics and/or throughput (e.g., parallel) computing functions that support the operation of a larger computing system. The expansion card 50 may therefore have a slot installation edge 52 with contact pads that can be inserted into a corresponding connecting slot on a mother board (not shown). In the illustrated example, the front side of the expansion card 50 has a main processor/co-processor chip (e.g., semiconductor package, silicon die) 54 and a plurality of supporting components 56 such as, for example, memory chips, voltage regulator chips, etc., wherein the processor chip 54 and the supporting components 56 may generate heat during operation. The back side of the expansion card 50 may also include supporting components 58 that can generate heat during operation.

Figure 2:
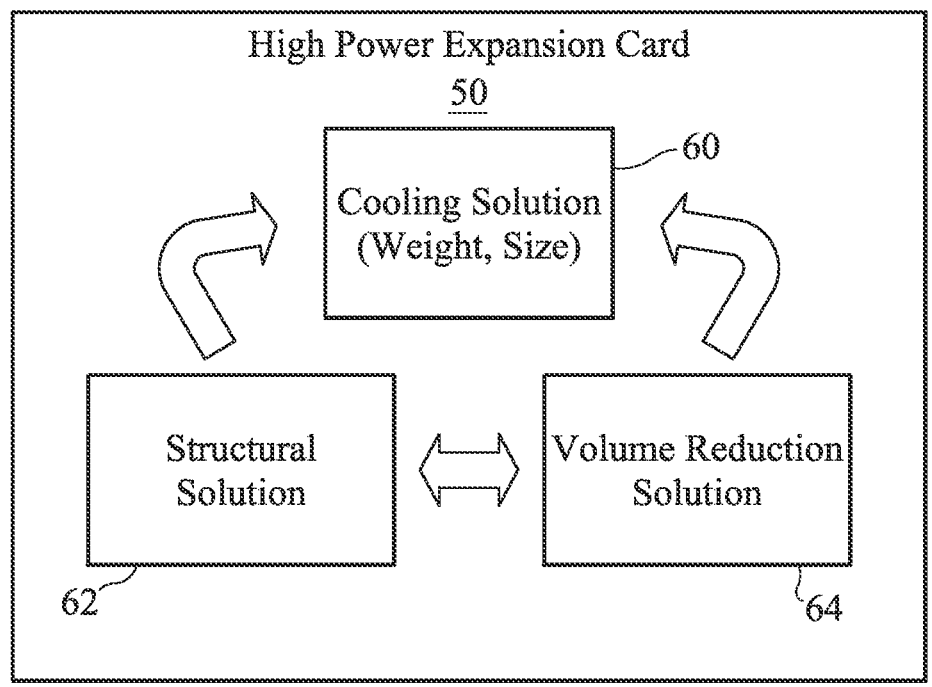
FIG. 2 is a block diagram of an example of an expansion card according to an embodiment.

FIG. 2 demonstrates that the expansion card 50 may include one or more cooling solutions 60 that contribute to the overall weight and size of the card 50. For example, the cooling solutions 60 may include a heat sink coupled, via a direct thermal connection, to a heat generating surface of the main processor chip 54 (FIG. 1), wherein the heat sink may he relatively large. The cooling solutions 60 may also include other, more aggressive components to support higher computing power and associated heat generation, as will be discussed in greater detail. The illustrated cooling solutions 60, however, have a synergistic relationship with one or more structural solutions 62 and one or more volume reduction solutions 64 that minimizes the impact of the cooling solutions 60 on the weight, size and shock resistance of the card 50. Accordingly, the solutions 60, 62, 64 may enable the card 50 to conduct processing intensive, high power operations without concern over excessive heat generation or reduced shock resistance, even in a computing system having tight volume constraints.

In particular, the cooling solutions 60 may include a unique metallic duct, centrifugal fan and/or secondary plate, the volume reduction solutions 64 may include a unique power connector, and the structural solutions 62 may include a clamp structure and/or an retention interlock, wherein one or more of these components may function as multiple types of solutions (e.g., the metallic duct may function as a cooling solution and a structural solution, the secondary plate may function as a cooling solution and a volume reduction solution, and so forth). Moreover, one or more of these components can reinforce and/or enhance the positive impact of one or more of the other components. For example, a number of the components may enable the heat sink to be enlarged, which can provide for more aggressive cooling. Accordingly, the solutions 60, 62, 64 may he considered "synergistic".

Metallic Duct

Figure 3:
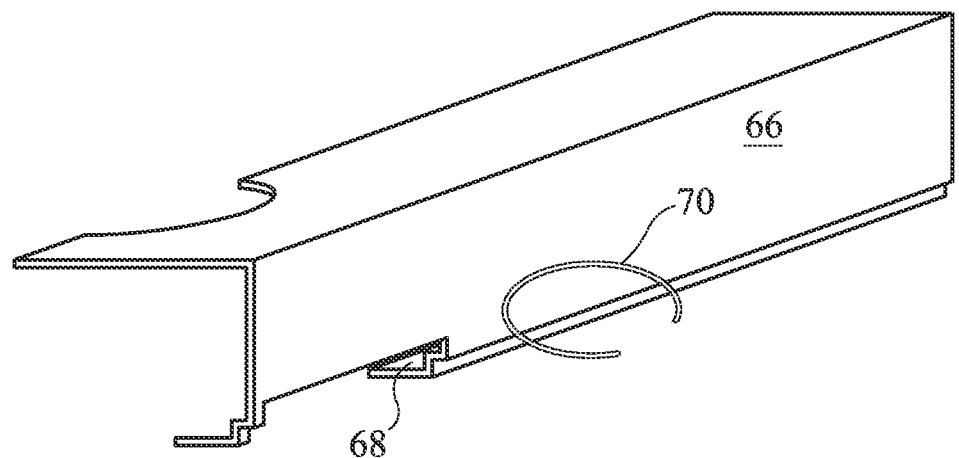
FIG. 3 is a perspective view of an example of a metallic duct according to an embodiment.

Turning now to FIG. 3, a metallic duct 66 is shown. The illustrated metallic duct 66 has one or more flange surfaces such as a flange surface 68, which, if the duct 66 is mounted to the front side of an expansion card such as the card 50 (FIG. 1A), will have a direct thermal connection with one or more of the heat generating semiconductor packages also mounted to the first side of the card. Thus, the flange surface 68 might have a direct thermal connection with the supporting components 56 (FIG. 1A) near the slot installation edge 52 (FIG. 1A), in the example shown above. Accordingly, the duct 66 may have a "hot spot" 70 corresponding to a semiconductor package that generates a particularly high amount of heat during operation. Indeed, the metallic (e.g., aluminum) composition of the illustrated duct 66 makes it a good conductor of heat. When used in conjunction with an air moving device such as a centrifugal fan (discussed below), the duct 66 may control airflow directionality in a manner that channels heat away from the expansion card.

Figure 4:
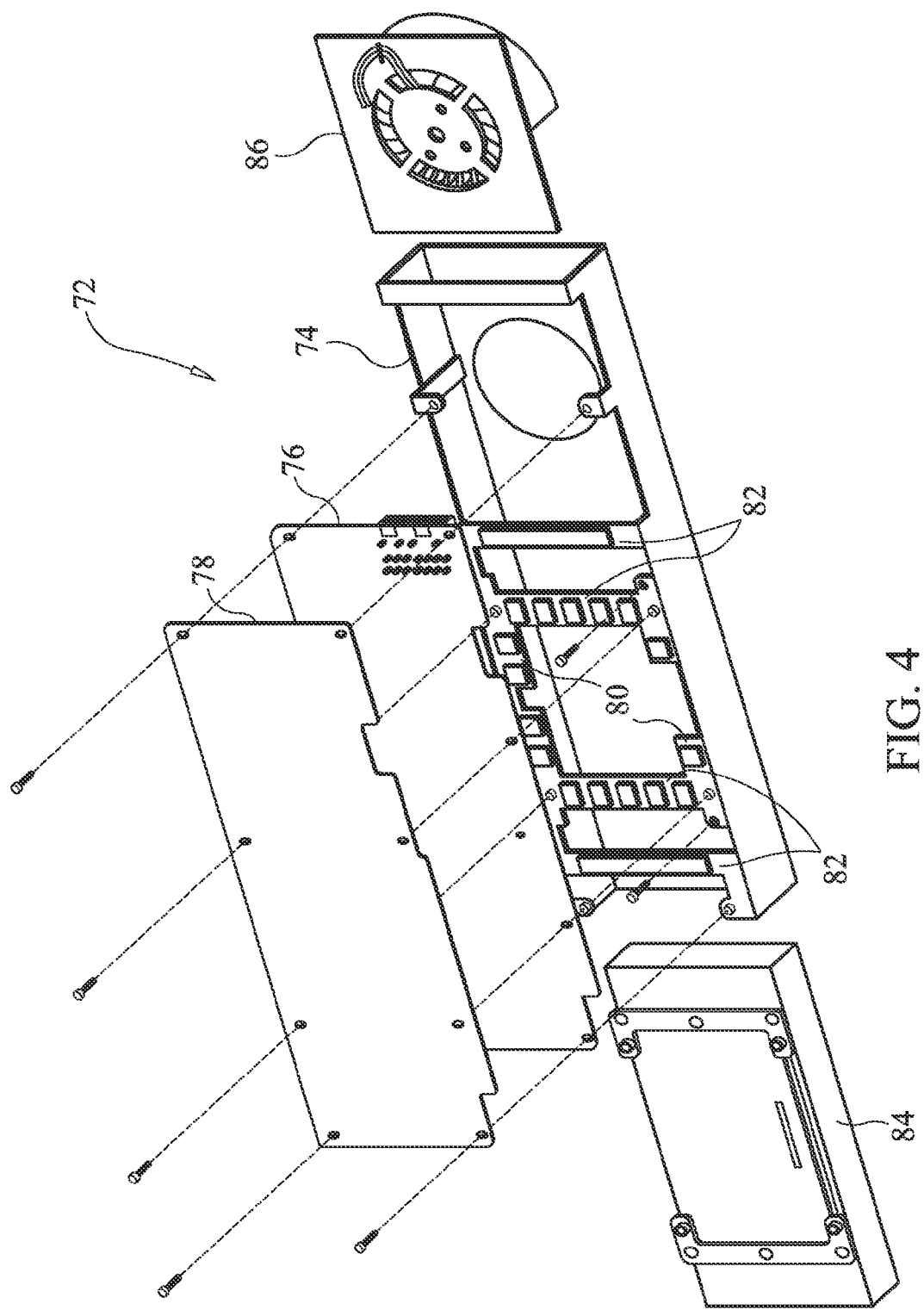
FIG. 4 is an exploded perspective view of an example of a circuit board assembly having a metallic duct according to an embodiment.

FIG. 4 shows an exploded view of a circuit board assembly 72 in which an expansion card 76 is sandwiched between a metallic duct 74 and a back plate 78. In the illustrated example, the metallic duct 74 includes peripheral flange surfaces 80 that have a direct thermal connection with semiconductor packages mounted near the periphery of the front side (not shown) of the expansion card 76, as well as "web" flange surfaces 82 that have a direct thermal connection with semiconductor packages mounted in the center portion of the front side (not shown) of the expansion card 76. The flange surfaces 80, 82 may include a thermal interface material (illustrated as squares and rectangles) such as, for example, a gap filler/pad or a curable liquid that enhances the thermal conductivity of the interface between the semiconductor packages and the flange surfaces 80, 82.

The thermal interface material can also provide a resistive spring force to ensure tight coupling between components during assembly.

The illustrated circuit board assembly 72 also includes a heat sink 84 that slides into the metallic duct 74, which may have either a rectangular or "C-shaped" cross section, and makes direct thermal contact with a processor chip mounted to the front side (not shown) of the expansion card 76. A centrifugal fan 86 may also slide into the metallic duct 74, wherein the fan 86 may create airflow through the duct 74 and across the heat sink 84. Thus, the illustrated duct 74 is a unique cooling solution that controls airflow directionality away from the expansion card 76. In addition, the duct 74 may provide a structural solution in that it may function as a clamp to the expansion card 76 in order to prevent vibrations of the expansion card 76 if, for example, a computing system containing the circuit board assembly 72 is dropped during shipping.

Figure 5:
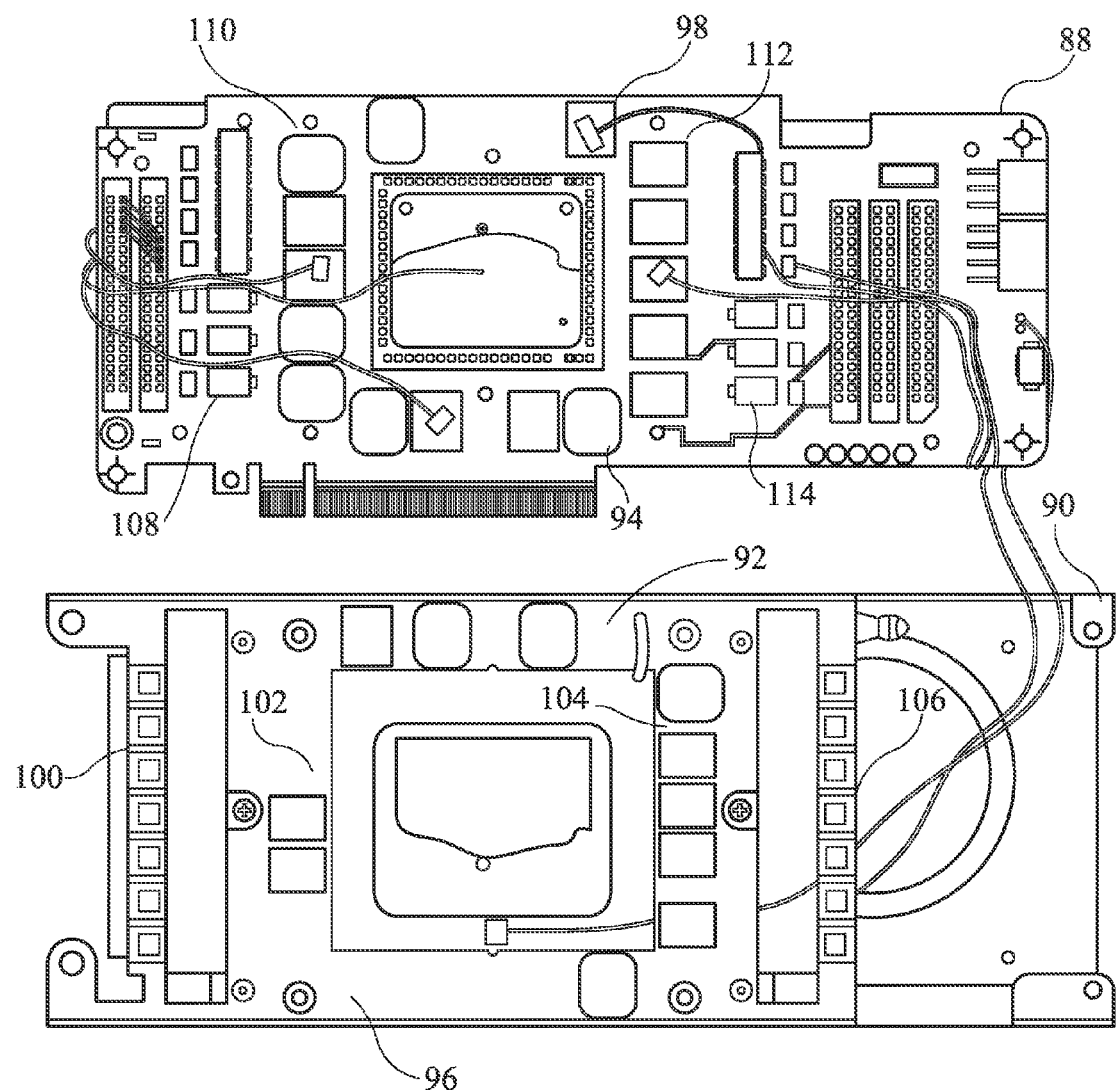
FIG. 5 is a plan view of an example of an expansion card and a metallic duct according to an embodiment.

FIG. 5 shows an enlarged view of a disassembled expansion card 88 and metallic duct 90. In the illustrated example, the front side of the expansion card 88 and the back side of the metallic duct 90 (i.e., the interacting faces), are shown. The metallic duct 90 may have a peripheral flange surface 92 that has a direct thermal connection with a set of peripherally mounted chips 94 after assembly, and a peripheral flange surface 96 that has a direct thermal connection with a set of peripherally mounted chips 98 after assembly. In addition, the metallic duct 90 can have web flange surfaces 100, 102, 104 and 106 that have direct thermal connections with sets of internally mounted chips 108, 110, 112, and 114, respectively. As already noted, the peripherally mounted chips 94, 98 and/or the internally mounted chips 108, 110, 112, 114, may include memory such as GDDR (graphics double data rate, e.g., Synchronous Dynamic Random Access Memory/SDRAM, DDR3 SDRAM JEDEC Standard JESD79-3C, April 2008), voltage regulators, and so forth.

Figure 6:
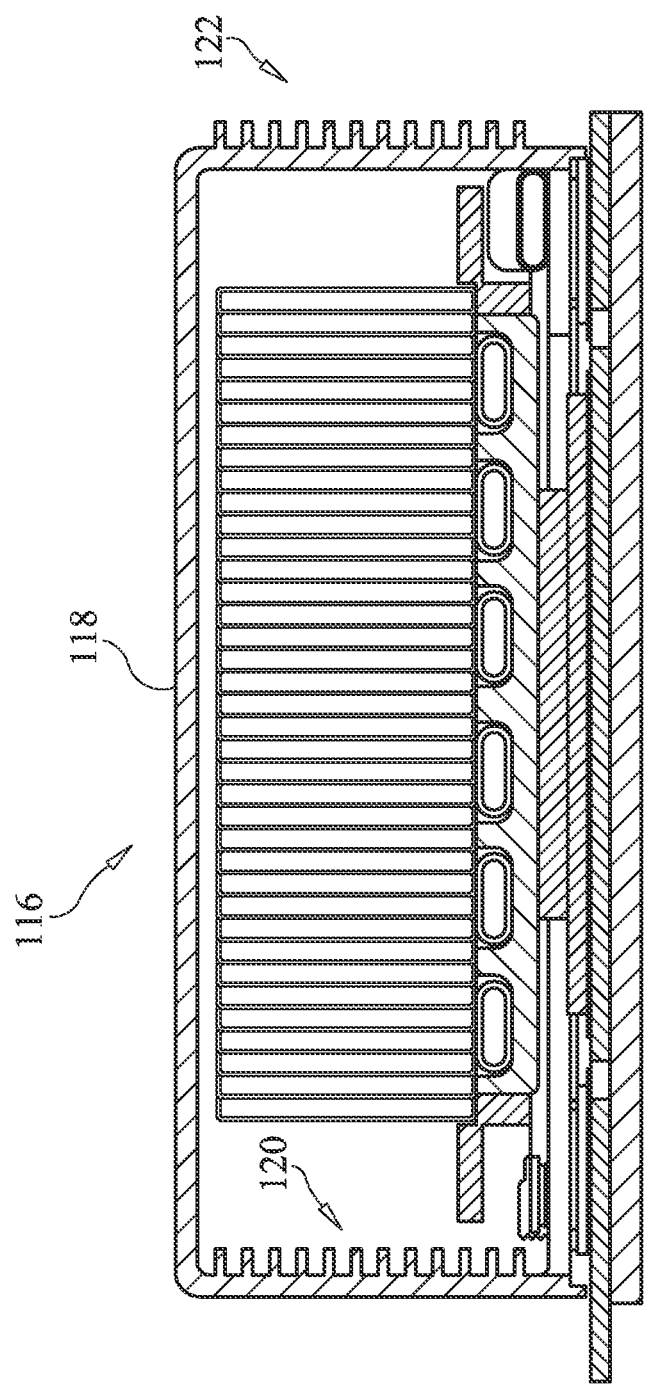
FIG. 6 is a sectional view of an example of a circuit board assembly having a metallic duct with cooling fins according to an embodiment.

FIG. 6 shows a sectional view of a circuit board assembly 116 having a metallic duct 118 with a first set of cooling fins 120 coupled to an internal surface of the metallic duct 118 and second set of cooling fins 122 coupled to an external surface of the metallic duct 118. The cooling fins 120, 122, may be extruded from the same piece of material used for the duct 118, or stamped and coupled to the surfaces of the duct 118 via a suitable adhesion compound, weld, solder, etc. The cooling fins 120, 122 can further enhance the ability of the metallic duct 118 to dissipate the heat generated by the chips mounted to the expansion card.

Figure 7A:
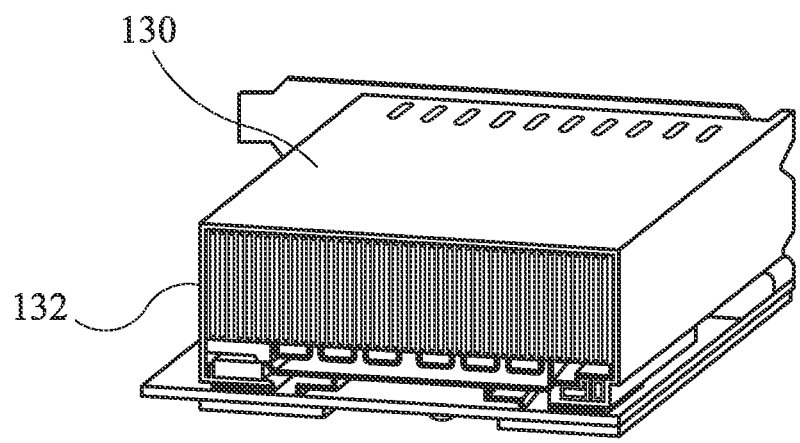
FIGS. 7A and 7B are sectional views of examples of direct thermal connections between metallic duct flange surfaces and semiconductor packages according to an embodiment.
Figure 7B:
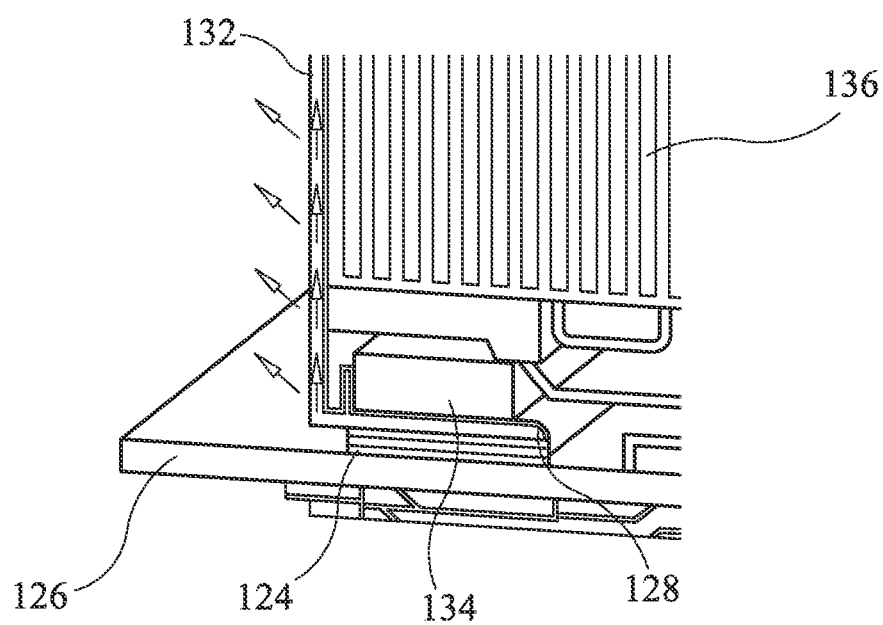

FIGS. 7A and 7B show an expansion card 126 having a chip 124 mounted thereon (e.g., via ball grid array/BGA technology), wherein the chip 124 has a direct thermal connection with a peripheral flange surface 128 of a metallic duct 130. At least a portion of the heat generated by the illustrated chip 124 is conducted through a wall 132 of the metallic duct 130 and into the ambient air. A heat pipe 134 may also be coupled to another side of the peripheral flange surface 128, wherein the heat pipe 134 can carry heat away from the chip 124 and to another cooling system component such as a heat sink 136.

The illustrated approach may therefore dissipate heat from supporting components, wherein such dissipation can enable the heat sink coupled to the main processor to be enlarged. Indeed, larger heat sinks may in turn enable higher processing speeds and enhanced performance. Moreover, the illustrated approach may provide stiffness to expansion cards, protect the structural integrity of BGA packages, and provide a mechanism for directing and controlling the airflow through the card's primary cooling solution (e.g., main processor heat sink).

Clamp Structure

Figure 8:
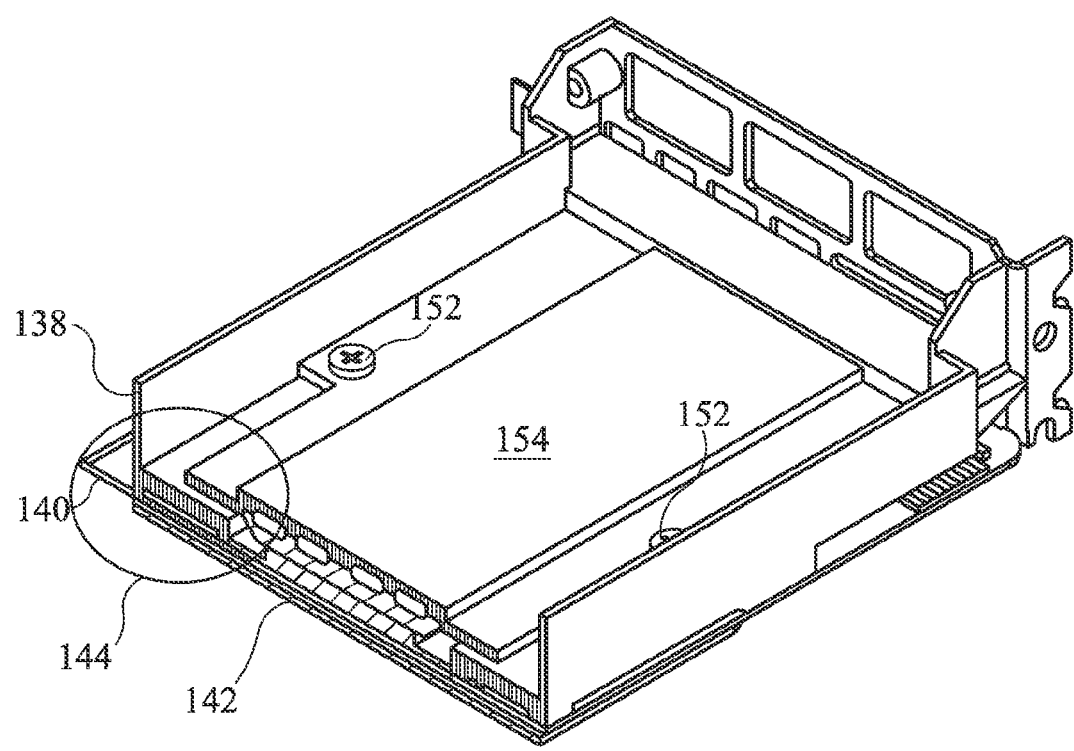
FIG. 8 is a sectional view of an example of a clamp structure according to an embodiment.
Figure 9:
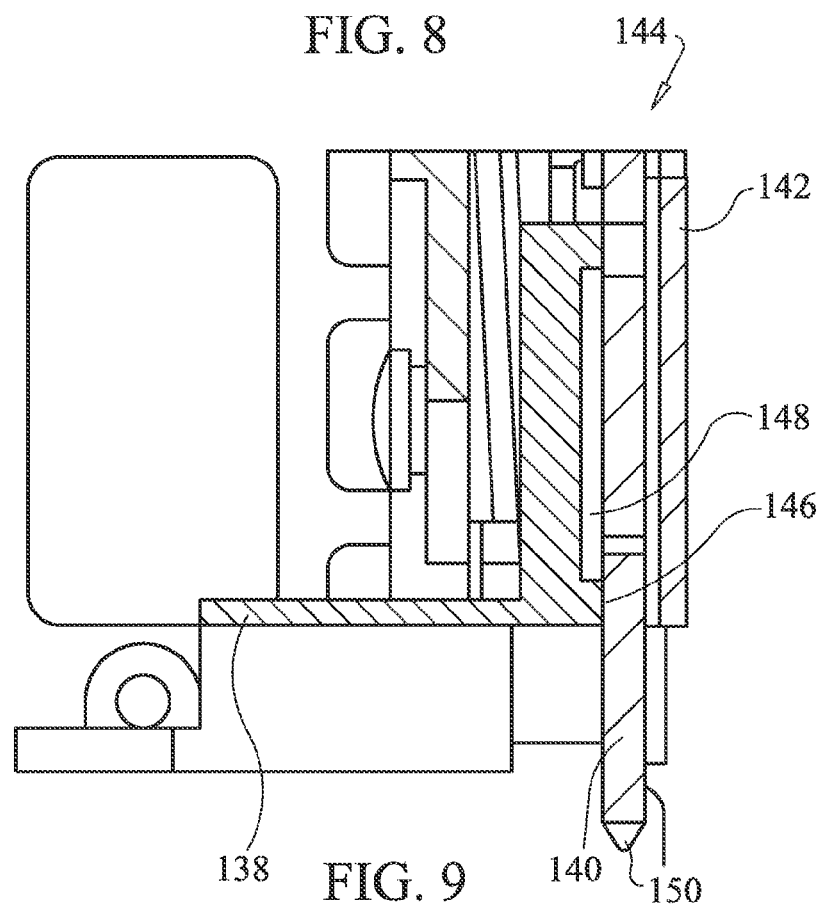
FIG. 9 is an enlarged sectional view of an example of a clamp structure according to an embodiment.

As already noted, a metallic duct may be used to provide structural support to expansion cards. FIGS. 8 and 9 demonstrate that a clamp structure may also be used for structural support, wherein the clamp structure can be deployed in addition to, or instead of a metallic duct. In the illustrated example, a primary clamp structure 138 is coupled to the front side of an expansion card 140 and a secondary clamp structure 142 is coupled to the back side of the expansion card 140. In particular, the enlarged view of region 144 shows that the primary clamp structure 138 may include a top edge surface 146 that contacts a peripheral portion of the front side of the expansion card 140 and clamps the expansion card 140 between the secondary clamp structure 142 and the primary clamp structure 130. The illustrated primary clamp structure 138 is an integral piece that extends around the perimeter of the expansion card 140, although other configurations may he used. For example, the primary clamp structure 138 may include a metallic duct (not shown) having a top edge surface that contacts the peripheral portion of the from side of the expansion card 140 and clamps the expansion card 140 between the secondary clamp structure 142 and the metallic duct. In addition, the secondary clamp structure 142 is illustrated as a plate having a bottom surface that contacts the back side of the expansion card 140, wherein a fastening mechanism such as one or more screws 152 are coupled to the secondary clamp structure 142, the primary clamp structure 138, and a heat sink 154, although other configurations may be used.

In particular, the top edge surface 146 of the primary clamp structure 138 may be positioned adjacent to a chip 148 that is mounted (e.g., via a ball grid array/BGA) near a slot installation edge 150 of the expansion card 140. In fact, another top edge surface can is be positioned adjacent to the chip 148 on the other side of the chip 148, as shown. Accordingly, the illustrated approach provides substantial structural support in an area of the card 140 that may be prone to broken solder joints if the card 140 is subjected to shock forces. Indeed, the placement of semiconductor packages such as the chip 148 adjacent to the slot installation edge 150 may be considered a unique board layout that is enabled by the use of the illustrated clamp structure.

Figure 10C:
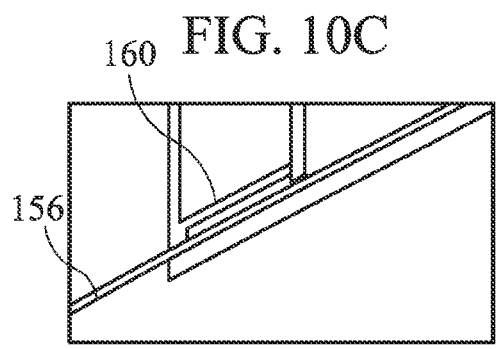
FIGS. 10A-10D are illustrations of examples of deflection and stress measurements associated with a clamp structure according to an embodiment.
Figure 10D:
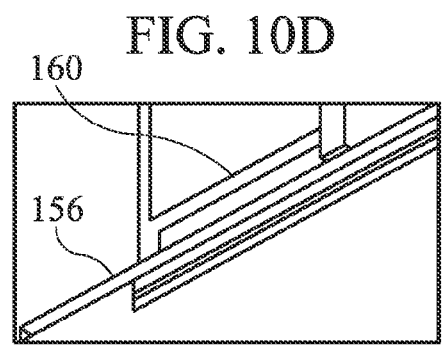
Figure 10A:
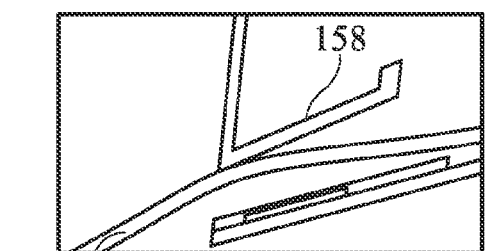
Figure 10B:
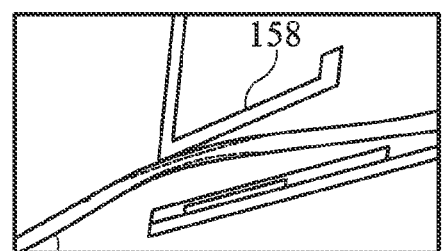
Figure 11:
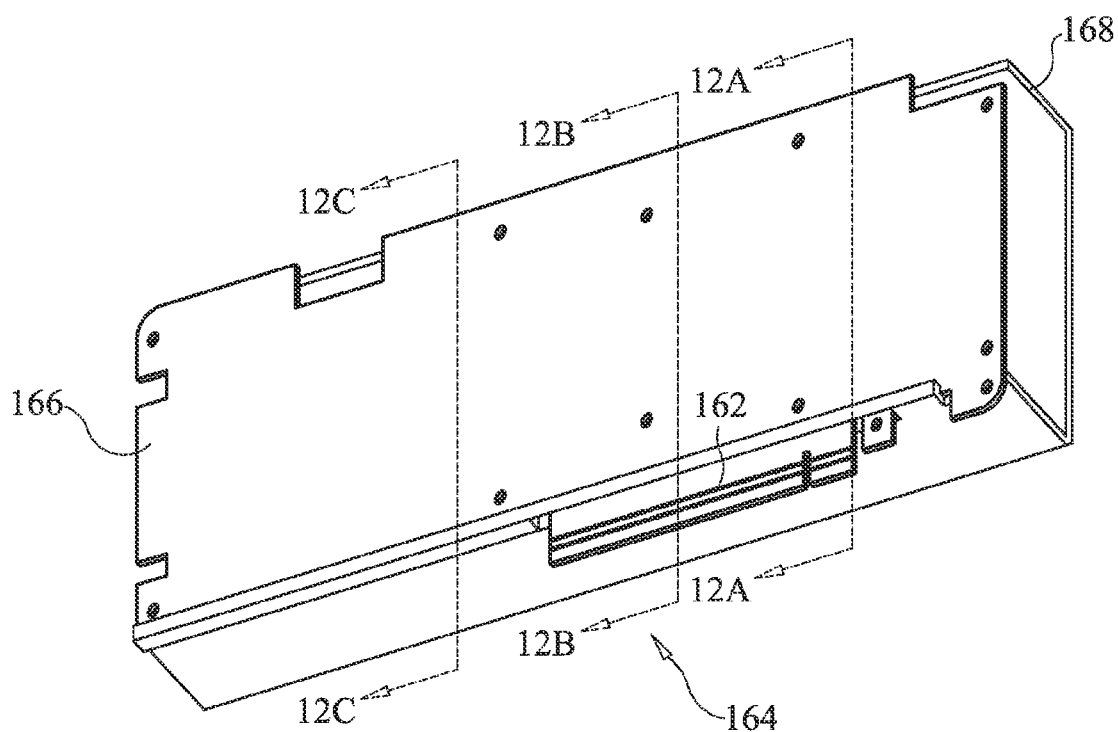
FIG. 11 is a perspective view of an example of a clamp structure having a clamp slot according to an embodiment.
Figure 12C:
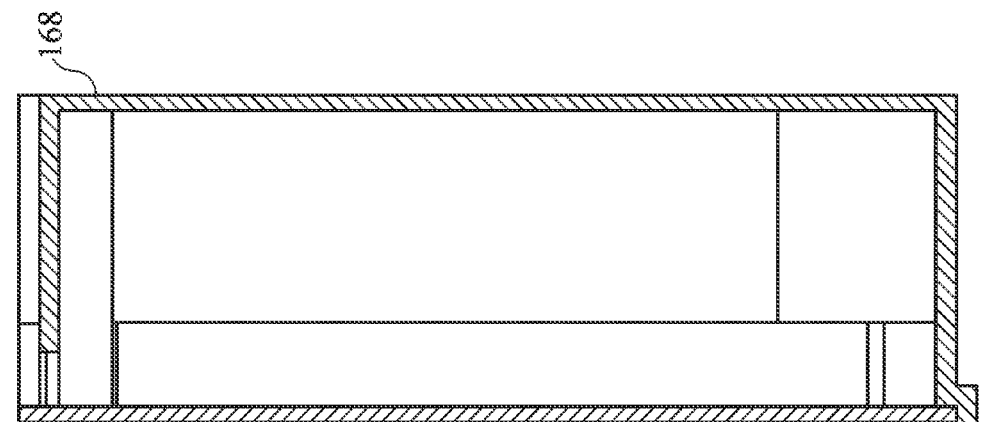
FIGS. 12A-12C are cross-sectional views taken along lines 12A-12A to 12C-12C, respectively, in FIG. 11.
Figure 12B:
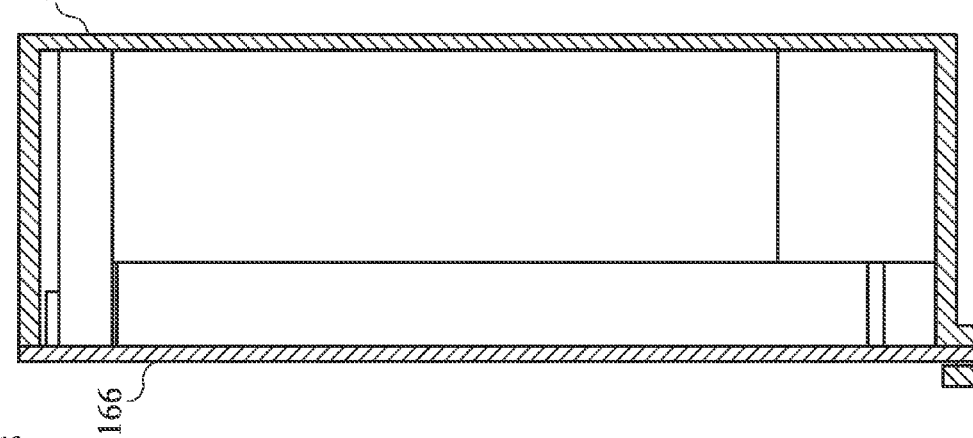
Figure 12A:
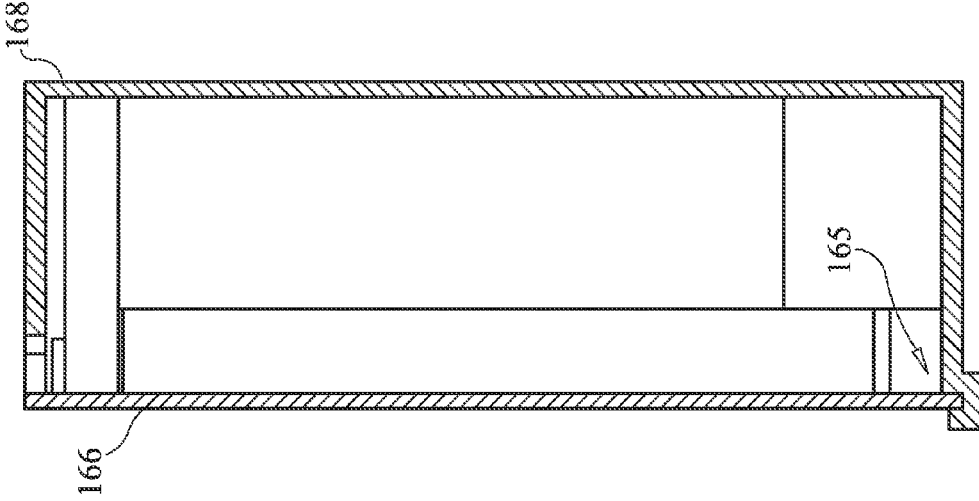

FIGS. 10A-10D show example deflection and stress results that may be obtained using the clamp structure techniques described herein. In particular, FIGS. 10A and 10B show the displacement and stress, respectively, of an expansion card 156 that is clamped by a primary clamp structure 158 that has a relatively wide top edge surface. FIGS. 10C and 10D demonstrate that displacement and stress, respectively, may be significantly reduced if a primary clamp structure 160 is configured to have narrower top edge surfaces that are able to contact the front side of the expansion card 156 directly on alternating sides of any semiconductor packages (not shown) that may be mounted near the edge of the expansion card 156.

Turning now to FIGS. 11 and 12A-12D, an alternative configuration of a clamp structure 168 is shown in which a slot installation edge 162 of an expansion card 166 is clamped by a clamp slot 164. In particular, FIGS. 12A-12C demonstrate that the bottom edge portions of the expansion card 166 not including the slot installation edge 162 can be clamped by a groove 165 formed on the interior of the clamp structure 168. The illustrated slot installation edge 162, on the other hand, is permitted to extend through the clamp slot 164 so that the expansion card 166 may be connected to a mother board (not shown). Thus, the clamp slot 164 includes the aforementioned front edge surface and bottom surface of the clamp structure 168, in the illustrated example.

Thus, the illustrated approach may prevent BGA devices from being susceptible to damaged solder balls and/or pad craters, even if the devices are placed near the slot installation edge of an expansion card. Accordingly, the risk of potential shipping-relate damage can he reduced and/or eliminated.

Secondary Plate

Figure 13A:
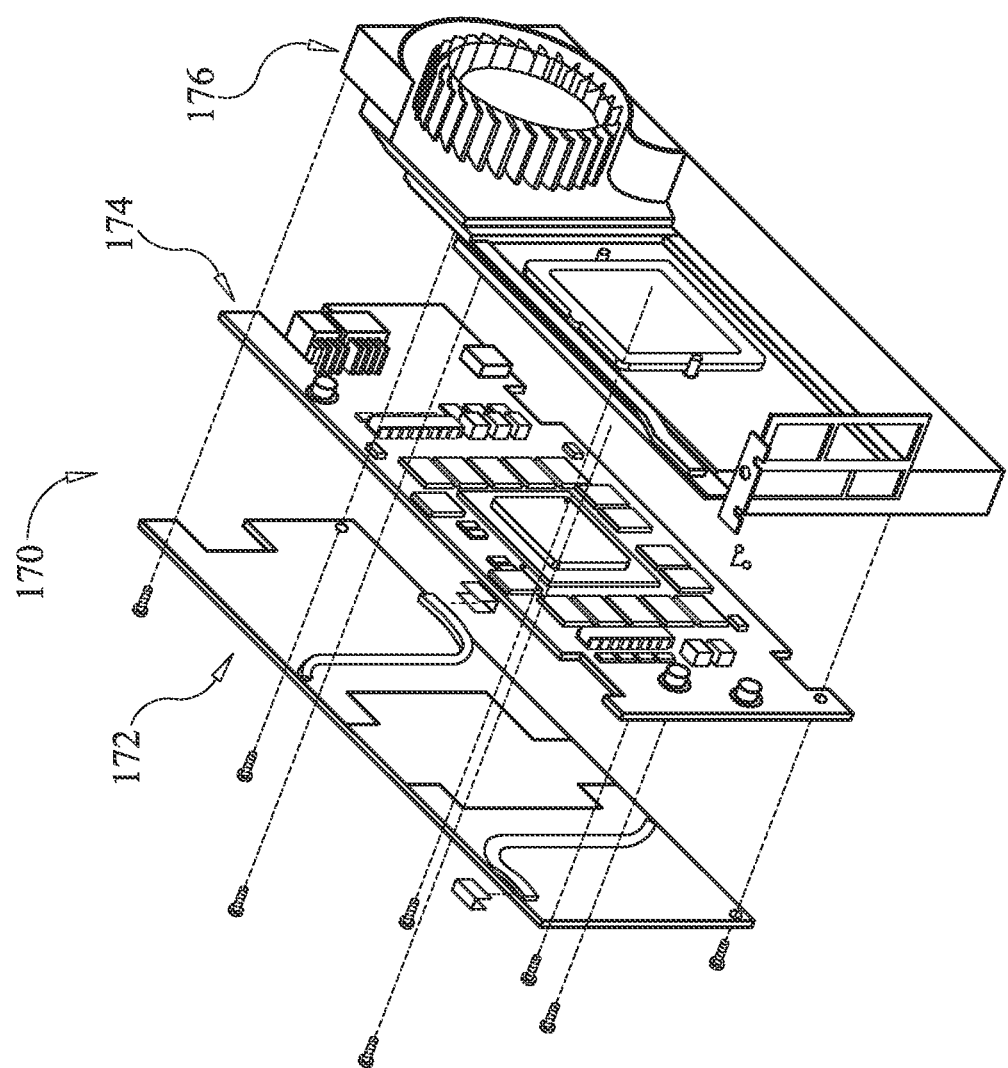
FIGS. 13A and 13B are exploded perspective views of a front side and a back side, respectively, of an example of a circuit board assembly having a secondary plate according to an embodiment.
Figure 13B:
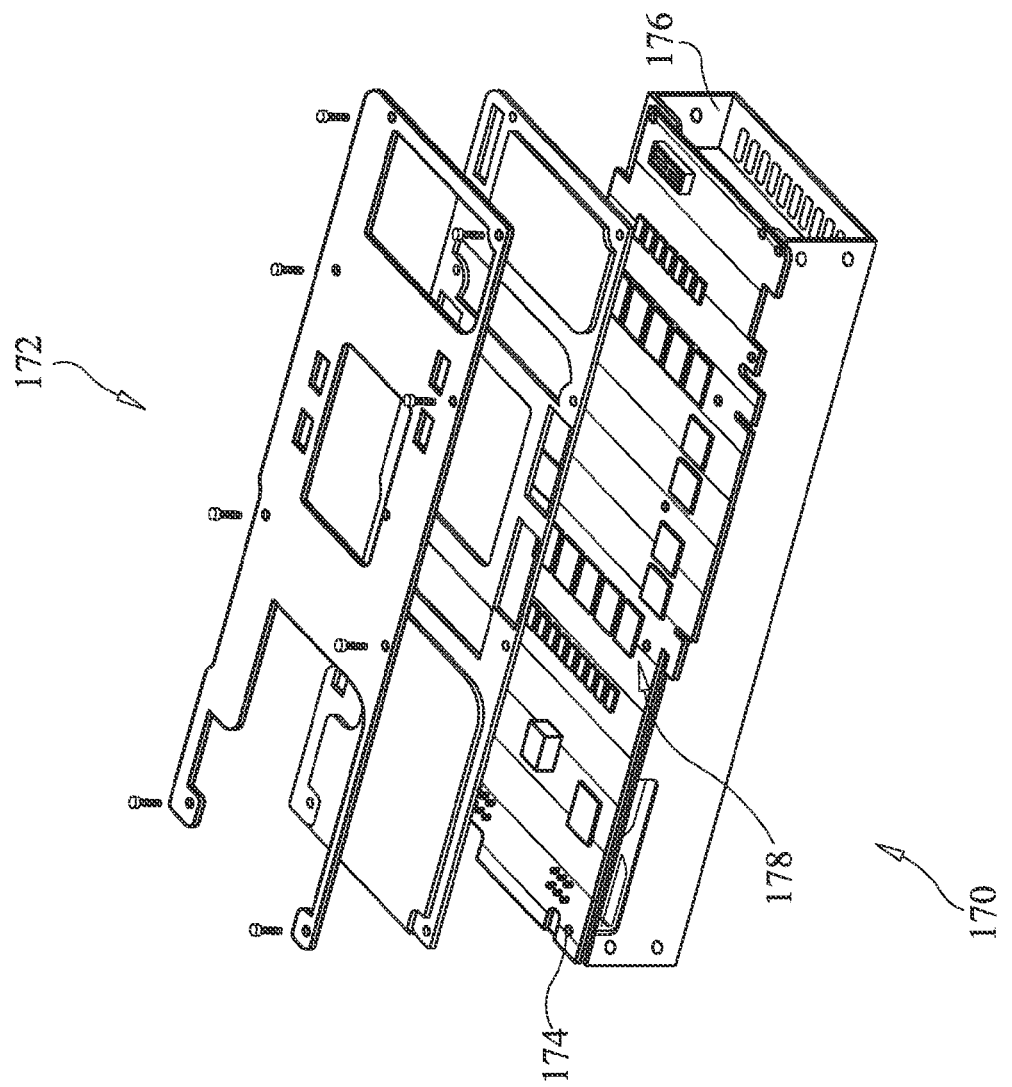

FIGS. 13A and 13B show a circuit board assembly 170 having a secondary plate 172 that is configured to route heat generated on the back side of an expansion card 174 to a heat sink assembly 176 coupled to the front side of the expansion card 174. In general, one or more chips 178 may be mounted to the back side of the expansion card 174, wherein the chips 178 might include heat generating circuits such as memory and/or voltage regulation circuits. Due to tight volume constraints that may prevent the addition of a heat sink to the is back side of the expansion card 174, the illustrated secondary plate 172 collects heat generated from the back side of the expansion card 174 and delivers it to the heat sink assembly 176 on the front side of the expansion card 174.

Figure 14A:
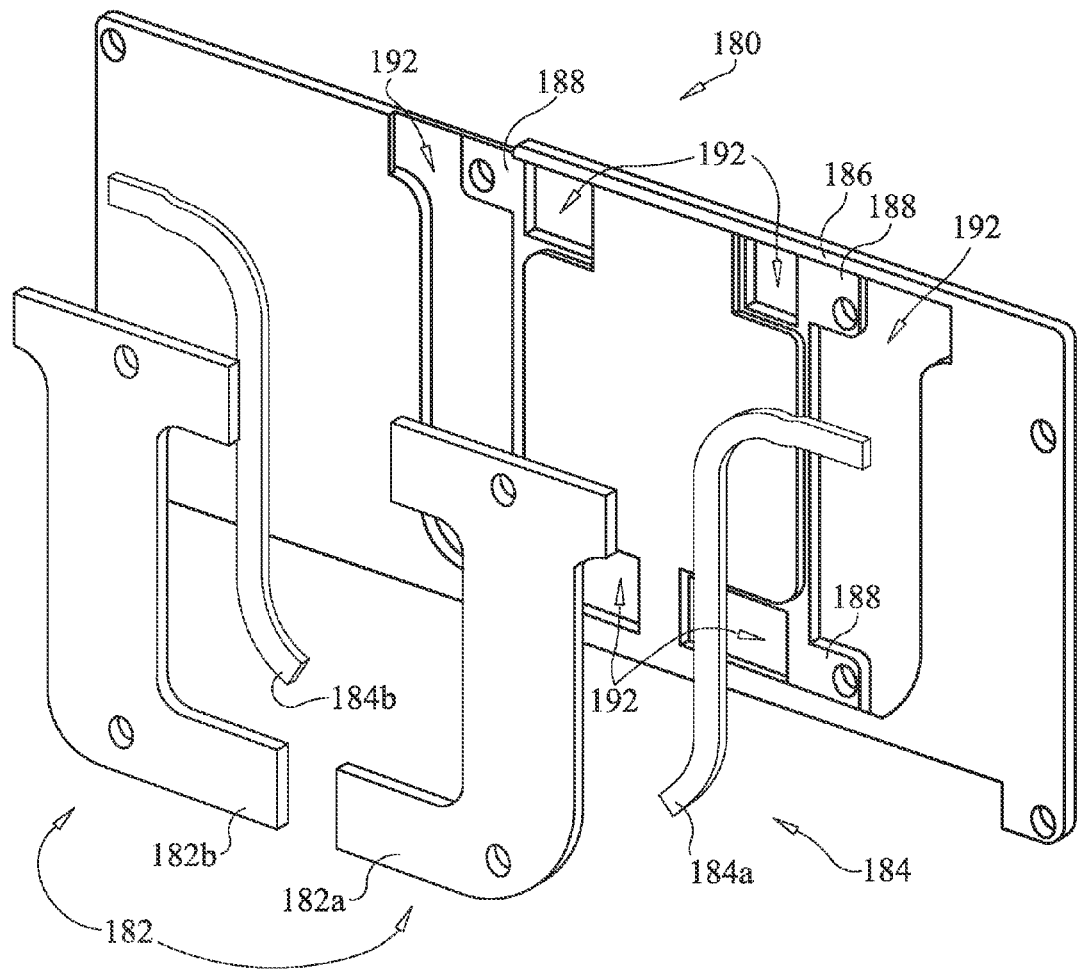
FIGS. 14A and 14B are perspective views of back side and front side, respectively, of an example of a secondary plate according to an embodiment.
Figure 14B:
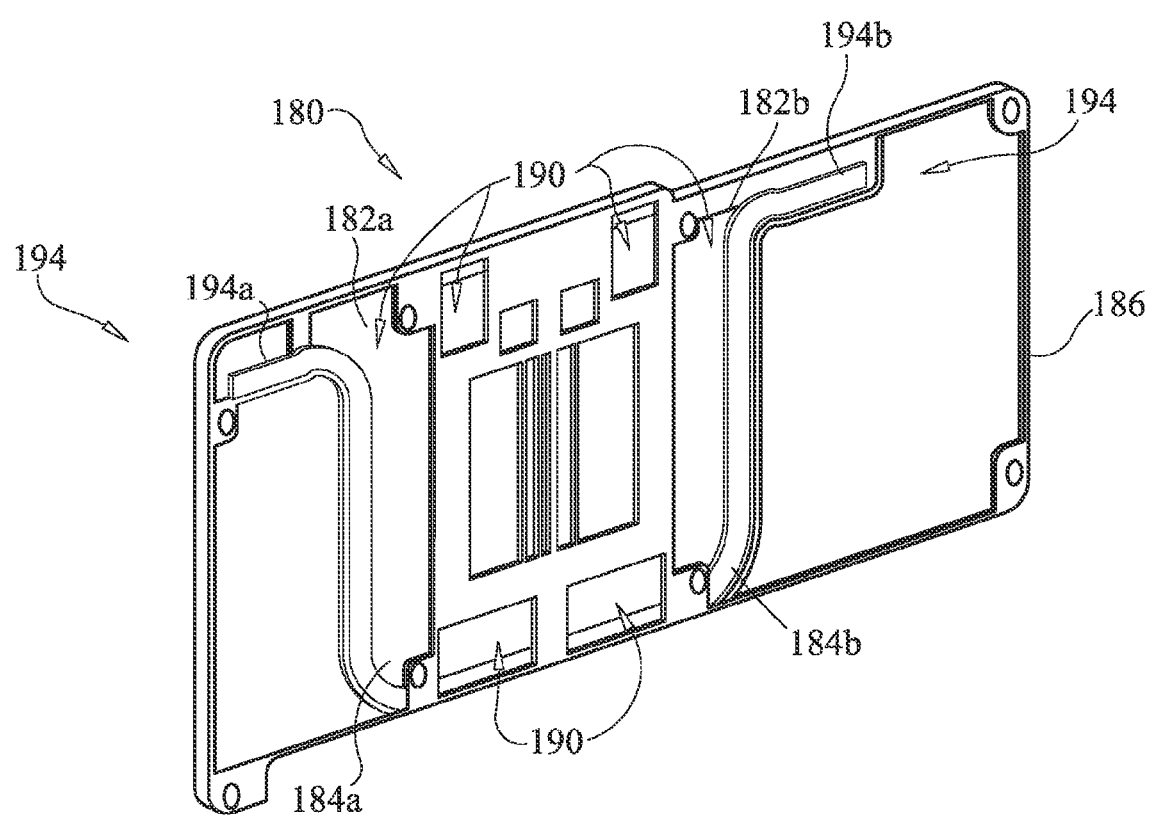

In particular, FIGS. 14A and 14B show back and front views, respectively, of a secondary plate assembly 180 including a set of heat pipes 184 (184a, 184b) that have a direct thermal connection with a corresponding set of copper plates 182 (182a, 182b). In general, after assembly with an expansion card (not shown), the heat pipes 184 and one or more chips (not shown) mounted to the back side of the expansion card may be sandwiched between the copper plates 182 and the back side of the expansion card.

In particular, the illustrated secondary plate assembly 180 also includes a carrier plate 186 (made of a material such as aluminum or magnesium) having edges defining one or more chip openings 192, as well as one or more recessed clamped portions 188 that are disposed between the copper plates 182 and the back side of the expansion card after assembly. Thus, the chips mounted to the back side of the expansion card may extend through the chip openings 192 and make a direct thermal connection with the copper plates 182 in one or more regions 190 (as best shown in FIG. 14B) of the copper plates 182. The illustrated heat pipes 184, which have a board height that is approximately equal to the board height of the chips mounted to the second side of the expansion card, also have a direct thermal connection with the copper plates 182. The shape of the chip openings 192, heat pipes 184, copper plates 182, and so forth, may vary depending upon the board layout and the positioning of the chips on the back side of the expansion card. For example, the illustrated heat pipes 184 mirror one another along the lateral axis of the secondary plate assembly 180, whereas the heat pipes of the aforementioned secondary plate 172 (FIGS. 13A and 13B) mirror one another along both the lateral and longitudinal axes.

Accordingly, heat generated by chips, such as chips 178 (FIG. 13B) or supporting components 58 (FIG. 1B), mounted to the back side of the expansion card may travel through the copper plates 182 to the heat pipes 184. As will be discussed in greater detail, the illustrated heat pipes 184 transfer this heat to the front side of the expansion card so that it may be removed via the cooling solution coupled to the front side of the expansion card. In this regard, one or more ends 194 (194a, 194b) of the heat pipes 184 may include a bend to facilitate a direct thermal connection between the heat pipes 184 and one or more heat pipes coupled to the front side of the expansion card. The bends could also he located elsewhere along the length of the heat pipes 184.

Figure 15:
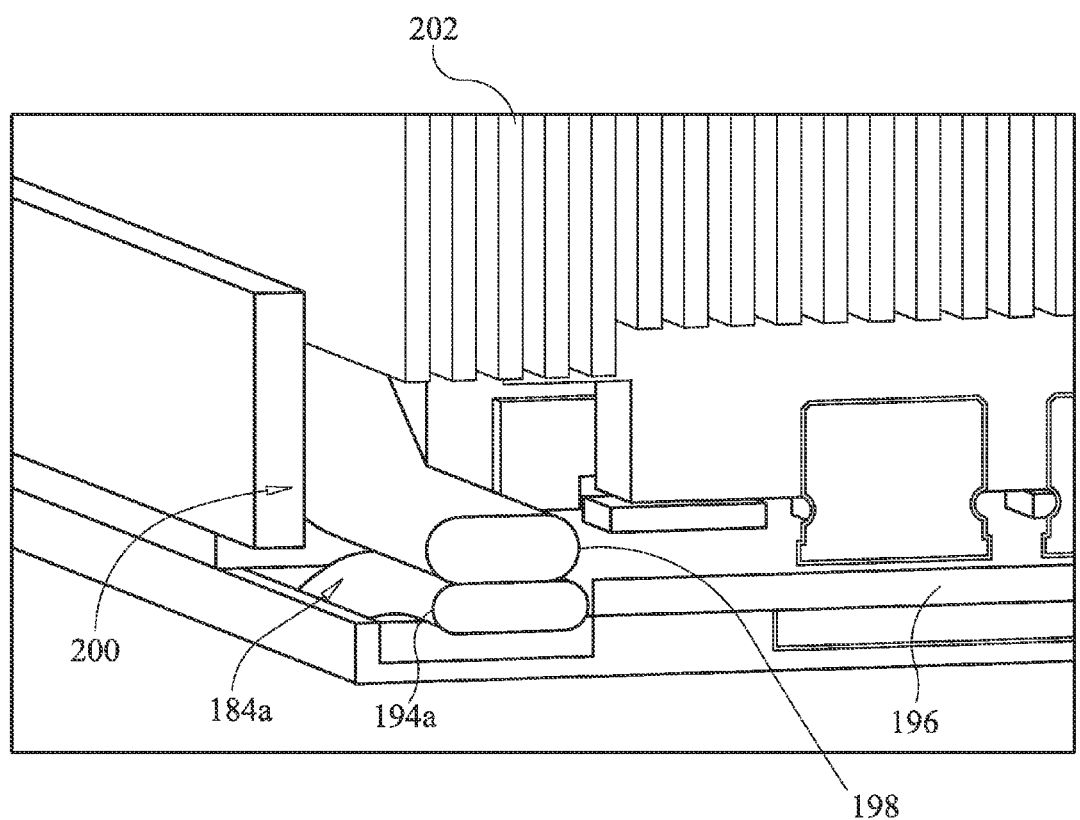
FIG. 15 is an enlarged sectional view of an example of a direct thermal connection between a front side heat pipe and a back side heat pipe according to an embodiment.

FIG. 15 demonstrates that notches may be made in an expansion card 196 to provide a pipe opening so that the end 194 of the heat pipe 184a may make a direct thermal connection is with an end 198 of another heat pipe 200 coupled to the front side of expansion card 196. The illustrated configuration also includes a heat sink 202 coupled to the front side of the expansion card, wherein the heat sink 202 has a direct thermal connection with the heat pipe 200. Accordingly, the heat sink 202 can be used to remove heat generated by chips mounted to the back side of the expansion card 196, although the heat sink 202 is mounted to the front side of the expansion card 196. Such a solution may be particularly advantageous in computing systems having tight volume constraints with regard to the back side of the expansion card 196.

The illustrated solution can also be combined with other solutions described herein, such as, for example, the aforementioned metallic ducts and/or clamp structures to further address cooling and/or structural concerns. For example, the heat pipe 200 might have a direct thermal connection with a flange surface of a metallic duct, a from side clamp structure, and so forth.

Centrifugal Fan

Figure 16A:
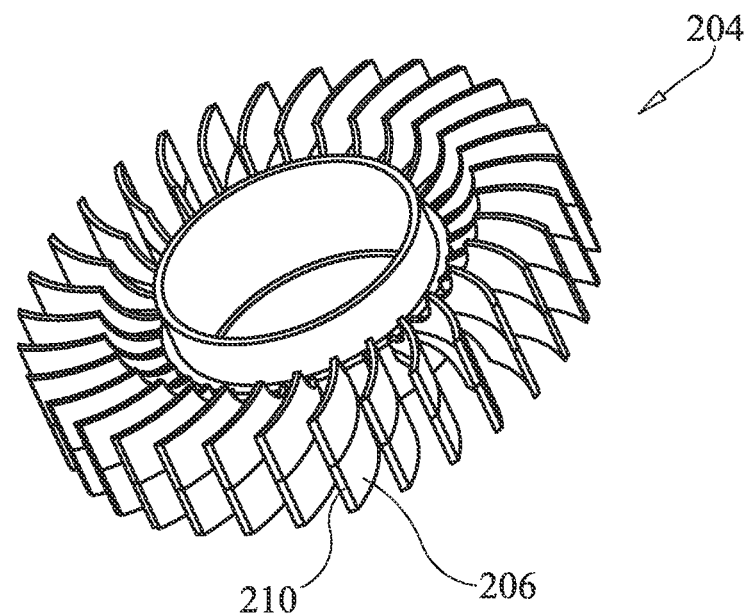
FIGS. 16A and 16B are perspective and plan views, respectively, of an example of a centrifugal fan impeller wheel according to an embodiment.
Figure 16B:
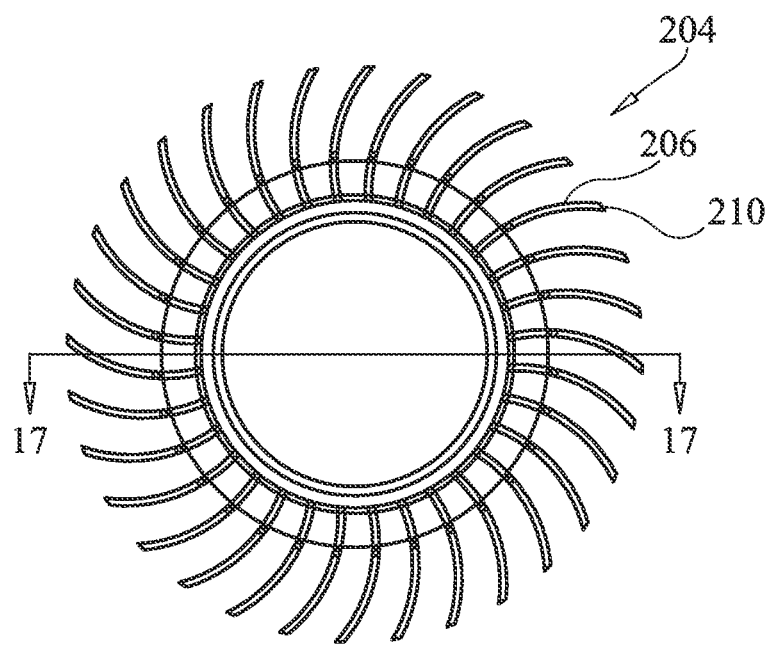
Figure 17:
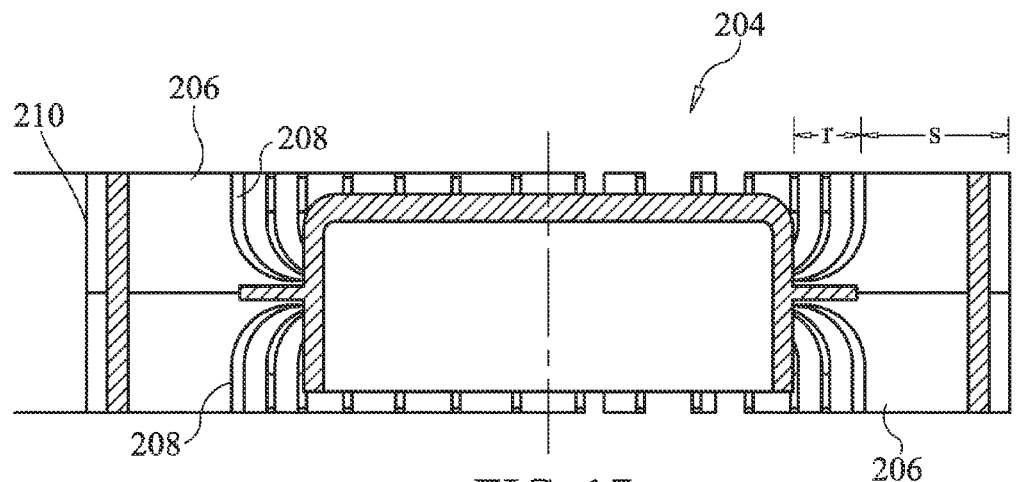
FIG. 17 is a cross-sectional view taken along lines 17-17 in FIG. 16 according to an embodiment.

FIGS. 16A, 16B and 17 show a fan impeller wheel 204 that may be installed in, for example, the fan 86 (FIG. 4), already discussed. The illustrated fan impeller wheel 204 includes a plurality of blades 206, wherein each blade 206 has a curved span, a pair of curved in board edges 208 (as best shown in FIG. 17) and an outboard edge 210. The distance between the curved in board edges 208 and the outboard edge 210 of each blade 206 may define the span ("s") of the blade 206, wherein the size and curvature of the span of the blade 206 can have a direct relationship to the ability of the blade 206 to move air.

Figure 18:
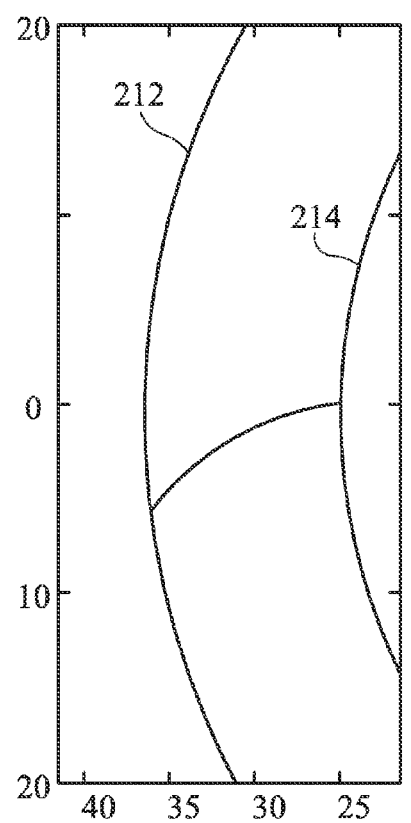
FIG. 18 is a plot of an example of fan blade curvature envelopes according to an embodiment.

In particular, a larger, more curved span may generate more airflow. In the illustrated example, the curved in board edges 208 have a reduced inner radius ("r") of approximately 25 mm in order to increase the span of the blade 206. While the outer radius defined by the outboard edge 210 could be increased to achieve a corresponding increase in span, such an approach can also increase the outer profile and overall size of the fan, and lead to volume concerns. Accordingly, the illustrated approach may enhance airflow without adding to overall size of the fan. FIG. 18 demonstrates that an outer envelope 212 associated with the outboard edge may be held constant, while an inner envelope 214 associated with the curved in board edges can be moved away from the outer envelope 212 in order to increase the span of the blades.

Figure 19:
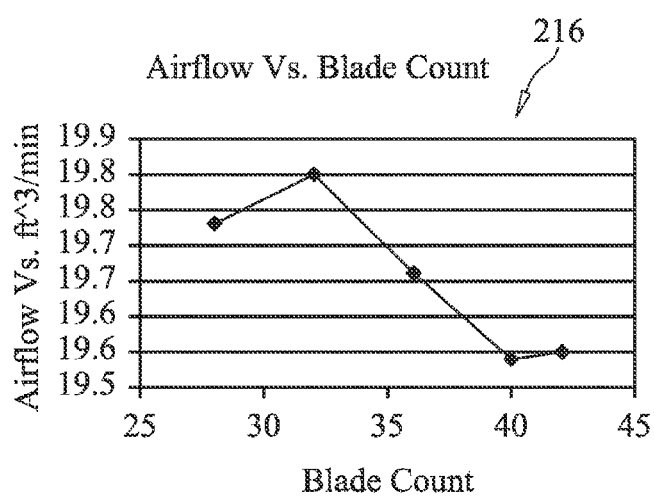
FIG. 19 is a plot of an example of airflow versus blade count according to an embodiment.

It has also been determined that the number of blades may impact the ability of the fan to move air. For example, FIG. 19 shows plot 216 in which an approximately one percent increase in airflow can be achieved by reducing the blade count from forty-two blades to thirty-two blades. Indeed, the optimization point of thirty-two blades may provide is unexpected results related to the additional internal volume that can be used to address other geometric parameters such as the aforementioned inner radius of the curved in board edges, blade angle, blade length, and so forth.

The illustrated solution, which may provide stronger airflow at acceptable acoustic levels, can enable better heat sink cooling for expansion cards. The illustrated solution can also be combined with other solutions described herein, such as, for example, the metallic ducts, clamp structures secondary plates, and so forth, to further address volume reduction and/or structural concerns. For example, a centrifugal fan having the illustrated impeller wheel may be incorporated into a metallic duct to provide enhanced structural performance as well as cooling performance.

Power Connector

Figure 20:
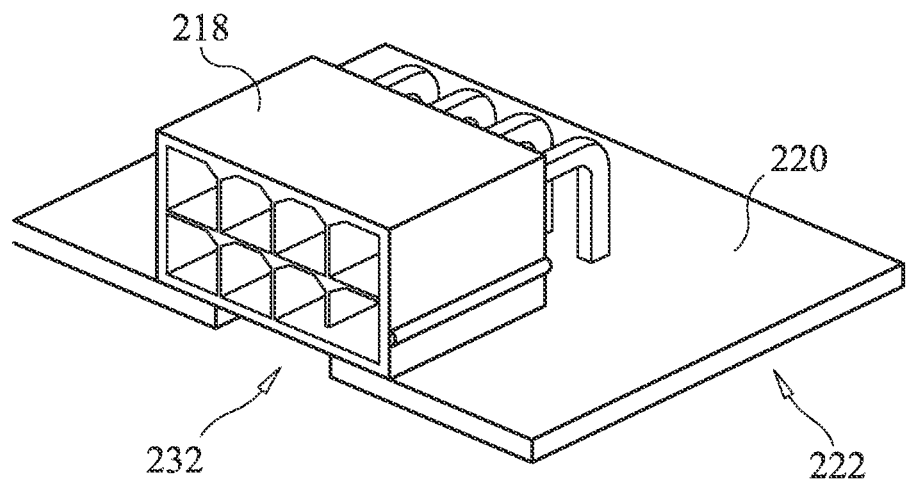
FIG. 20 is a perspective view of an example of a power connector according to an embodiment.
Figure 21A:
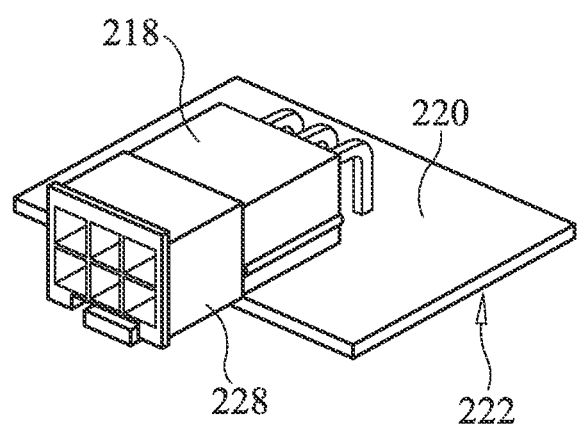
FIGS. 21A and 21B are front and back perspective views, respectively, of an example of a mating arrangement between a power connector and a plug according to an embodiment.
Figure 21B:
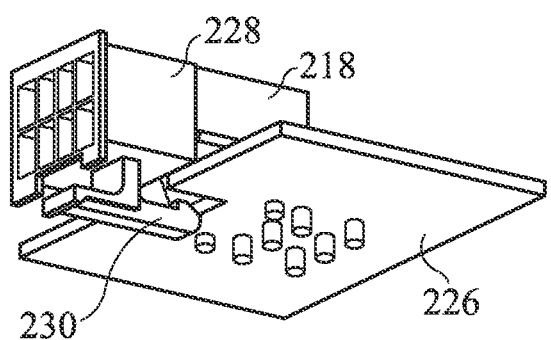
Figure 22:
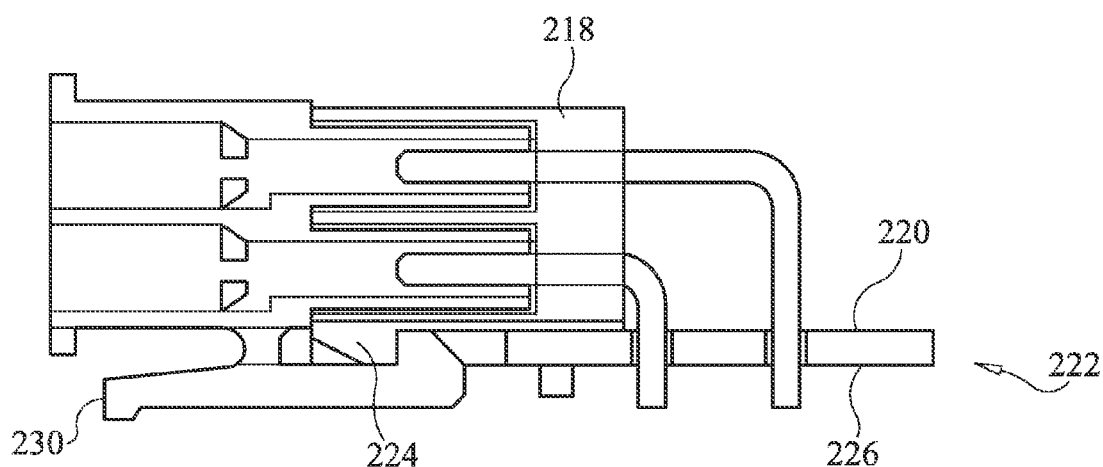
FIG. 22 is a side sectional view of an example of a mating arrangement between a power connector and a plug according to an embodiment.

FIGS. 20-22 show a power connector 218 that can provide a unique volume reduction solution for expansion cards. In the illustrated example, the power connector 218 is coupled to a front side 220 of an expansion card 222 in a "flipped" configuration so that a plug retention mechanism 224 (as best shown in FIG. 22) of the power connector 218 is disposed on a back side 226 of the expansion card 222. In one example, the expansion card 222 has surfaces defining a connector opening 232 (as best shown in FIG. 20), wherein the plug retention mechanism 224 is a protrusion that extends through the connector opening 232. Accordingly, a mating plug 228 may have a corresponding mechanism such as a clip 230 that engages with the plug retention mechanism 224 (as best shown in FIG. 22) if the plug 228 is inserted into the power connector 218.

Disposing the plug retention mechanism 224 on the back side 226 of the expansion card 222 may reduce the board height of the power connector 218 with respect to the front side 220 of the expansion card 222, while maintaining compatibility with the plug 228. In this regard, expansion cards such as the card 222 may have cumulative board height limits/allowances for both the front side 220 and the back side 226 of the expansion card 222. Thus, reducing the board height of the power connector 218 on the front side 220 can enable a heat sink such as the heat sinks 84 (FIG. 4), 136 (FIG. 7B), 154 (FIG. 8), 202 (FIG. 15), already discussed, a fan such as the fan 86 (FIG. 4), already discussed, and/or other cooling components to be increased in height/size in order to achieve a more aggressive cooling solution. Indeed, it is not uncommon for power connectors to consume a substantial portion of the cumulative board height allowance for a given expansion card. For example, if the cumulative board height limit for the front side 220 is about 35 mm, the illustrated configuration could reduce the board height of the power connector 218 by about 4 mm, which may enable a corresponding heat sink height increase of about 4 mm (with all other component heights remaining constant). Since the outer profile of the illustrated power connector 218 does not impact the mating arrangement with the plug 228, the height of the housing of the power connector 218 could also be reduced to achieve further volume reduction benefits. Indeed, it has been determined that an increase in total volumetric flow of about twenty percent may be achieved with the illustrated approach, wherein the total volumetric flow increase can translate into a co-processor thermal design power (TDP) increase of about 7.5 percent. Moreover, the usage of some of the cumulative board height allowance for the back side 226 of the expansion card 222 may be advantageous, even if a low profile cooling solution such as a secondary plate, discussed above, is deployed on the back side 226 of the expansion card 222.

Retention Interlock

Figure 23:
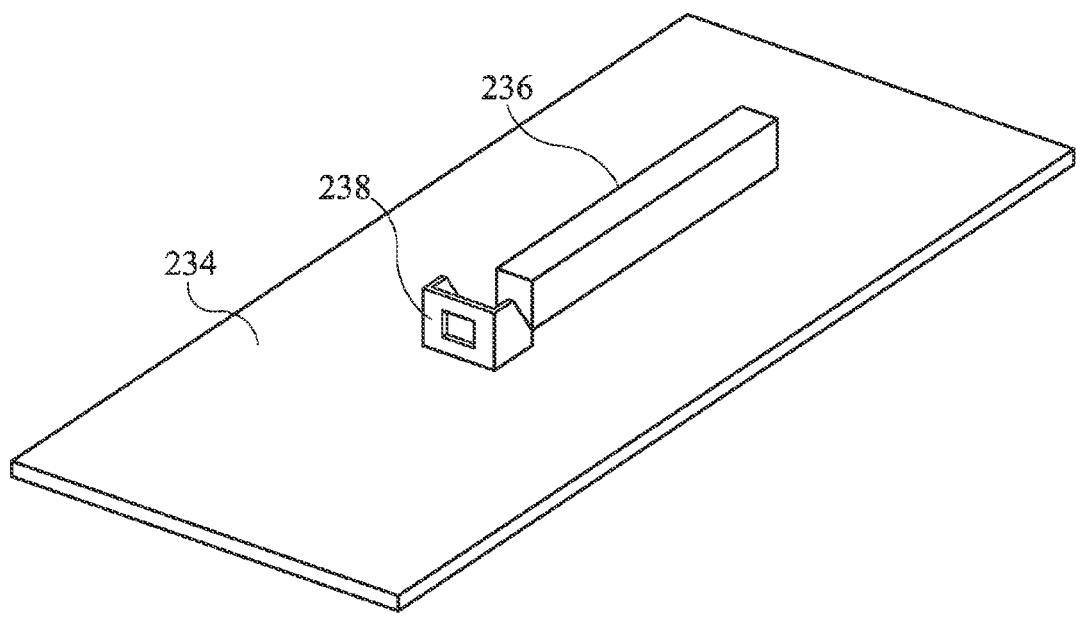
FIG. 23 is a perspective view of an example of a mother board having a retention clip according to an embodiment.
Figure 24:
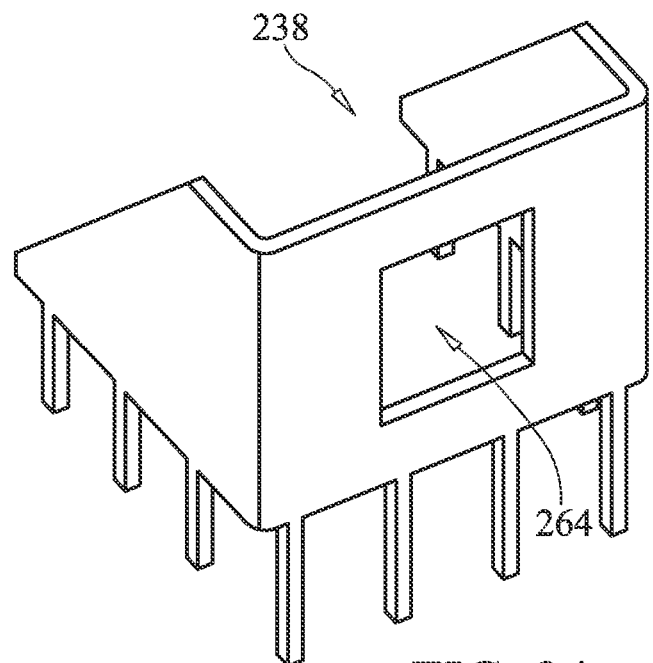
FIG. 24 is an enlarged perspective view of an example of a retention clip according to an embodiment.

Turning now to FIGS. 23 and 24, a mother board 234 is shown, wherein the mother board 234 includes a connection slot 236 and a clip 238 mounted to the mother board 234 adjacent to the connection slot 236. In the illustrated example, the clip 238, which may be constructed from a rigid material such as steel, has surfaces defining a clip aperture 264. As will be discussed in greater detail, an expansion card (not shown) may be plugged into the connection slot 236, wherein the clip 238 and the clip aperture 264 can provide a structural solution that reduces displacement and stress in the expansion card if a shock is applied to the mother board 234 such as a computer system containing the mother board 234 being dropped during shipping.

Figure 25:
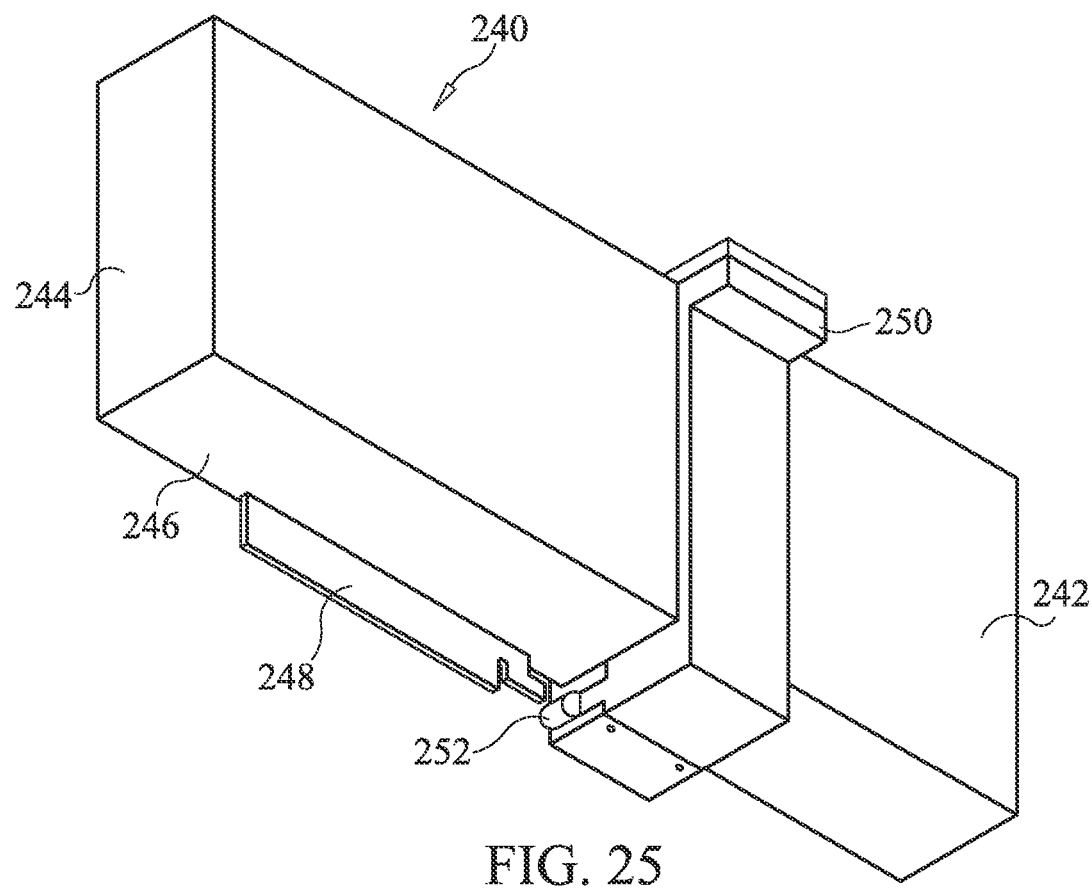
FIG. 25 is a perspective view of an example of an interlock and card bracket assembly according to an embodiment.
Figure 26:
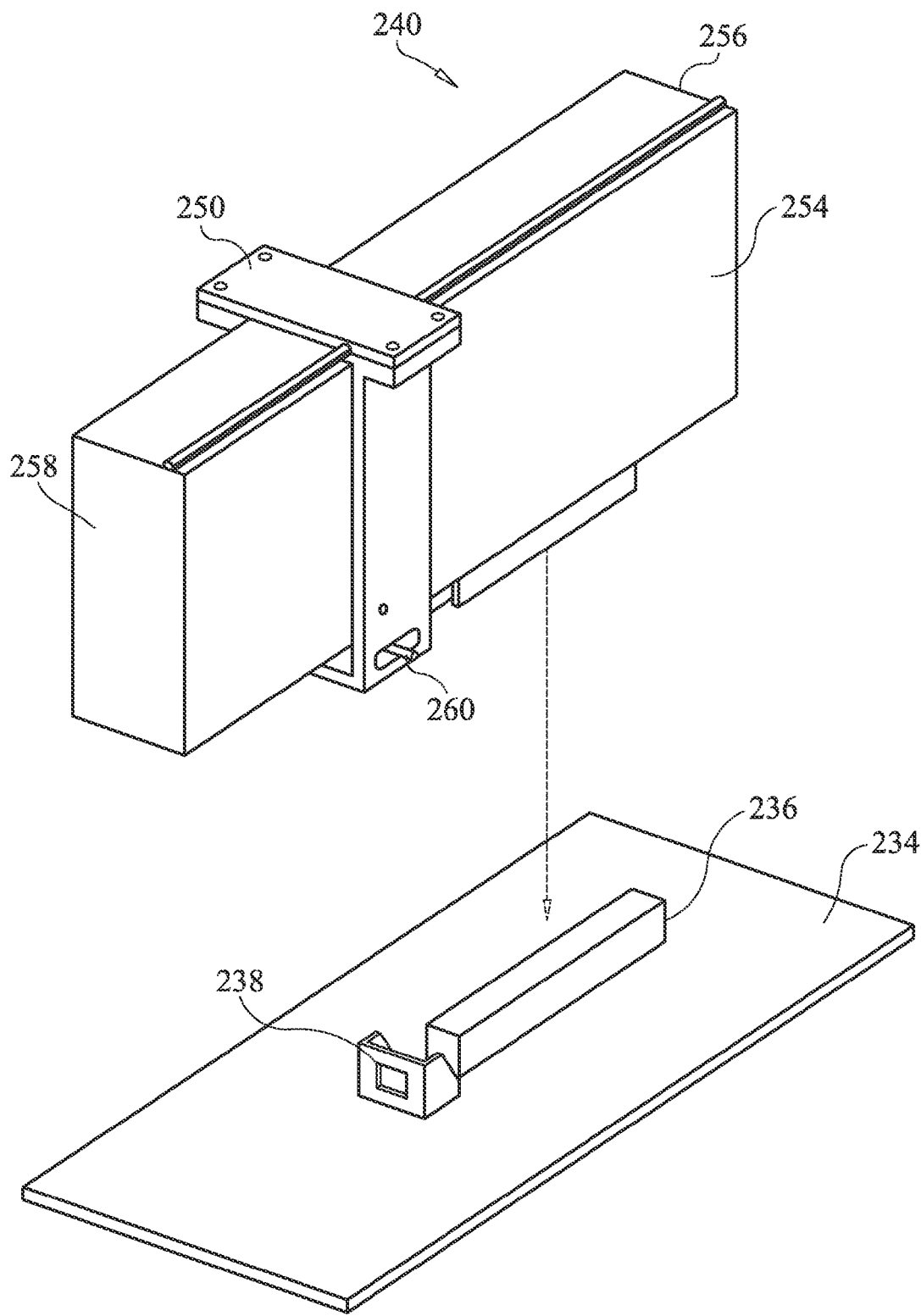
FIG. 26 is a perspective view of an example of an interlock and card bracket assembly prior to connection with a mother board according to an embodiment.
Figure 27:
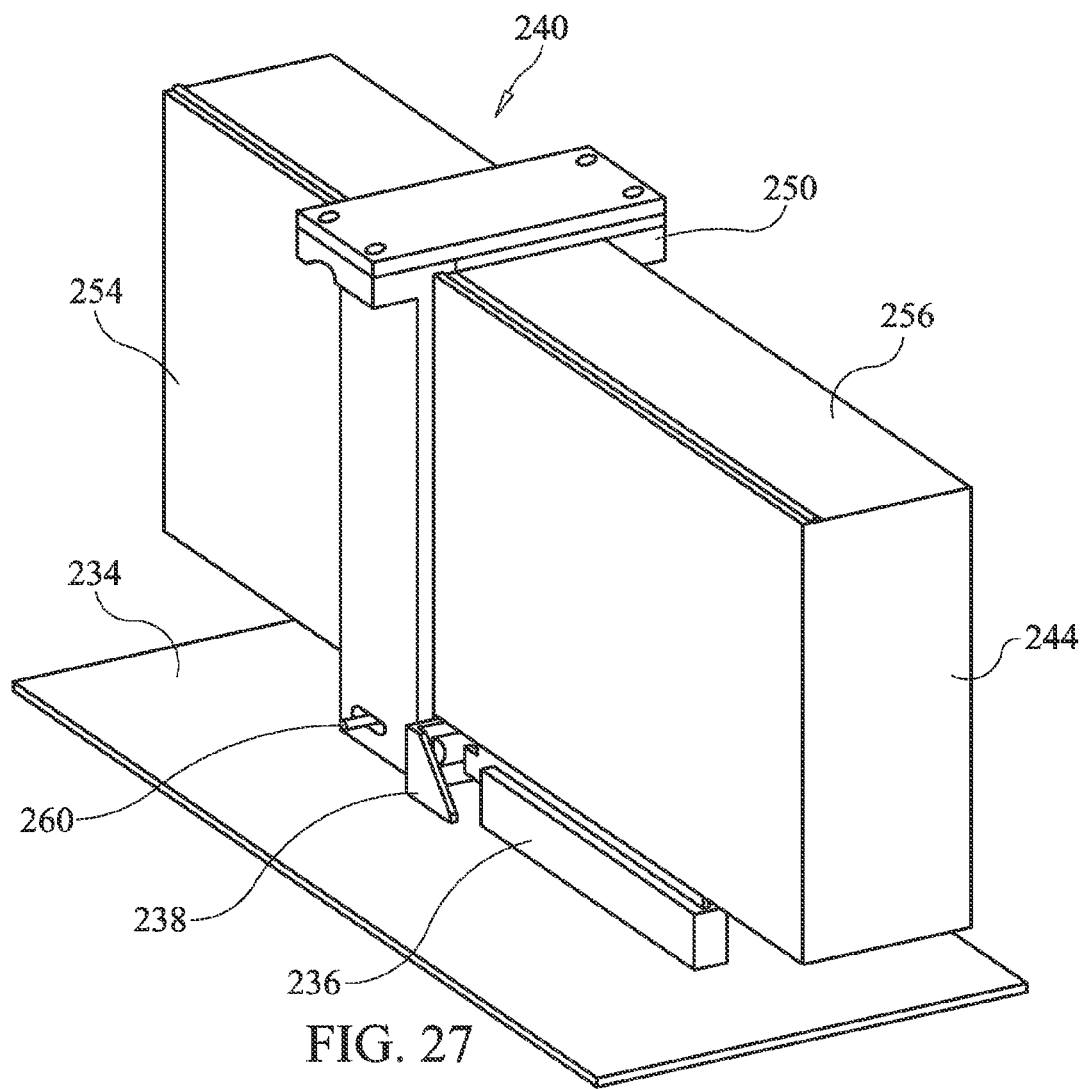
FIG. 27 is a perspective view of an example of an interlock and card bracket assembly after connection with a mother board according to an embodiment.
Figure 28:
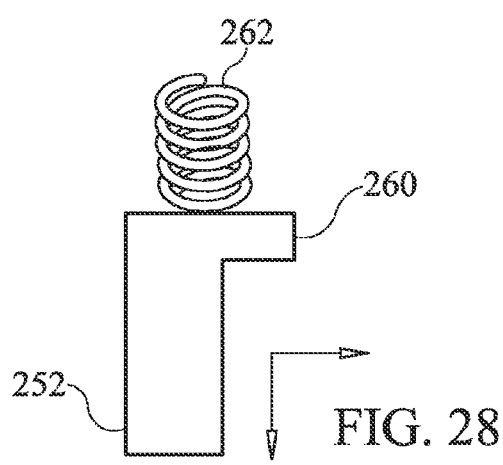
FIG. 28 is an enlarged view of an example of a fan interlock assembly according to an embodiment.

FIG. 25 shows an expansion card assembly 240 having a front side 242, a left side 244, and a bottom side 246 with a slot installation edge 248 extending from the bottom side 246. A card bracket 250 may be coupled to the expansion card assembly 240, wherein a longitudinal member 252 of an interlock extends through a longitudinal opening in the card bracket 250 and engages with the clip aperture 264 of the clip 238 (FIGS. 23 and 24) if the slot installation edge 248 is plugged into a mother board connection slot 236 (FIG. 23). Turning now to FIGS. 26 and 27, a right side 258, a back side 254 and a top side 256 of the expansion card assembly 240 are shown, wherein a lateral member 260 of the interlock extends through a lateral opening in the card bracket 250. FIG. 28 demonstrates that the interlock may include a spring mechanism 262 that is biased against the longitudinal member 252 so that if the lateral member 260 is used to compress the spring mechanism 262, the longitudinal member 252 can disengage from the clip aperture 264 (FIG. 24) and permit detachment of the expansion card assembly 240 (FIG. 27) from the mother board 234 (FIG. 27).

Figure 29:
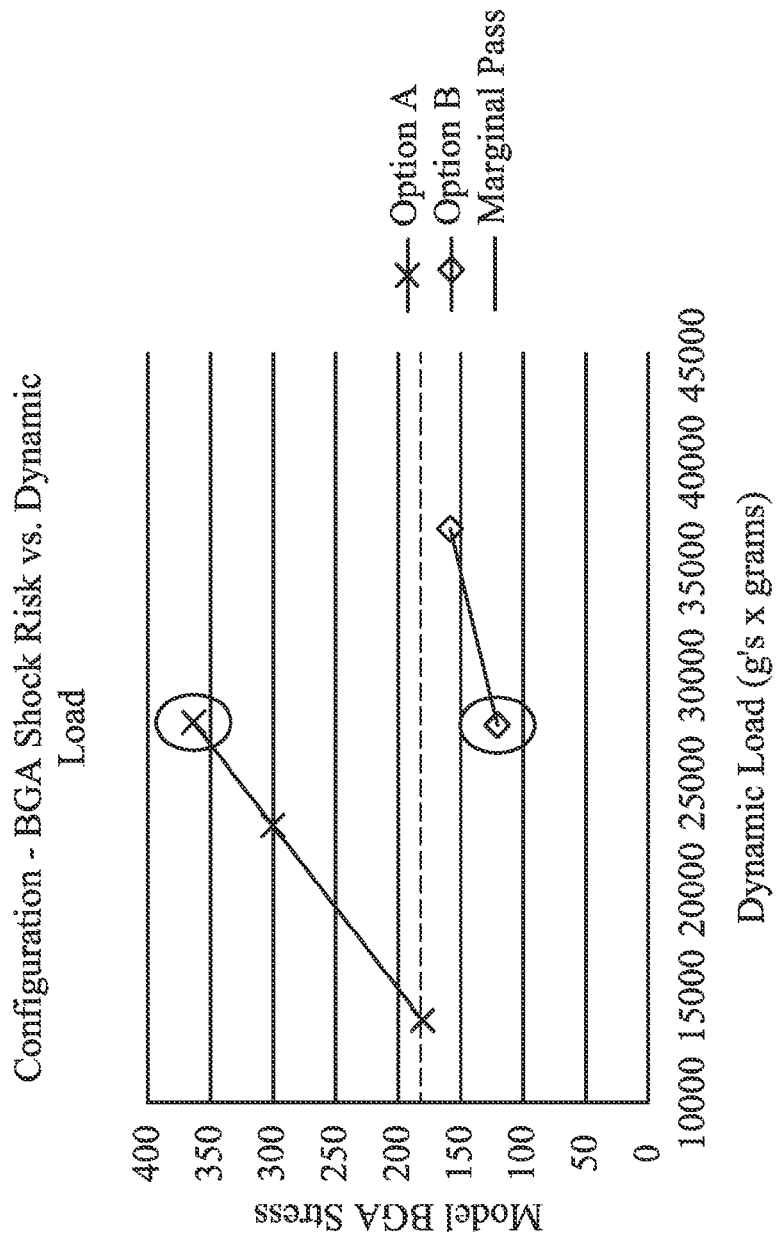
FIG. 29 is a plot of an example of shock risk versus dynamic load for a circuit board assembly having a retention mechanism according to an embodiment.

FIG. 29 shows a plot 266 of BGA shock risk versus dynamic load for a circuit board assembly without a retention interlock ("Option A") and for a circuit board assembly with a retention interlock as described herein ("Option B"). The illustrated plot 266 demonstrates that Option A may range from a marginally passing state to a substantially failing state for a set of dynamic load values that would result in a passing state in all instances for Option B. Indeed, Option B would have significantly more headroom under the marginally passing limit for a dynamic load that may produce a clear failure under Option A.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the, invention can be practiced without, or with variation of these specific details. The description is thus to he regarded as illustrative is instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. might be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A circuit board assembly comprising:
   an expansion card including a first side and a second side;
   a first set of semiconductor packages coupled to the first side of the expansion card;
   a metallic duct coupled to the first side of the expansion card, the metallic duct including one or more flange surfaces having a direct thermal connection with one or more of the first set of semiconductor packages;
   a second set of semiconductor packages coupled to the second side of the expansion card;
   a first heat pipe coupled to the first side of the expansion card, the first heat pipe having a direct thermal connection with the flange surface;
   a secondary plate coupled to the second side of the expansion card, the secondary plate having a direct thermal connection with one or more of the second set of semiconductor packages; and
   a second heat pipe coupled to the second side of the expansion card, the second heat pipe having a direct thermal connection with the secondary plate, wherein the expansion card includes surfaces defining a pipe opening, and wherein the first and second heat pipes contact one another through the pipe opening.

2. The circuit board assembly of claim 1, wherein the metallic duct includes at least one of a rectangular cross section and a C-shaped cross section.

3. The circuit board assembly of claim 1, further including one or more cooling fins coupled to at least one of an internal surface and an external surface of the metallic duct.

4. The circuit board assembly of claim 1, further including a clamp structure coupled to the second side of the expansion card, wherein the metallic duct further includes a front edge surface that contacts a peripheral portion of the first side of the expansion card and clamps the expansion card between the clamp structure and the metallic duct.

5. The circuit board assembly of claim 4, wherein the clamp structure includes a plate having a back surface, the circuit board assembly further including a fastening mechanism coupled to the plate and the metallic duct.

6. The circuit board assembly of claim 4, wherein the clamp structure includes a back surface associated with a clamp slot and the front edge surface is associated with the clamp slot.

7. The circuit board assembly of claim 4, wherein one or more of the first set of semiconductor packages are mounted via a ball grid array adjacent to a slot installation edge of the expansion card.

8. The circuit board assembly of claim 1, further including a heat sink coupled to the first side of the expansion card, the heat sink having a direct thermal connection with the first heat pipe.

9. The circuit board assembly of claim 1, wherein the second heat pipe has a board height that is approximately equal to a board height of the one or more of the second set of semiconductor packages.

10. The circuit board assembly of claim 9, wherein the second heat pipe and the one or more of the second set of semiconductor packages are sandwiched between the secondary plate and the second side of the expansion card.

11. The circuit board assembly of claim 1, further including a carrier plate having a clamped portion disposed between the secondary plate and the second side of the expansion card.

12. The circuit board assembly of claim 1, further including a centrifugal fan disposed within the metallic duct, the centrifugal fan having an impeller wheel with a plurality of blades.

13. The circuit board assembly of claim 12, wherein each blade of the centrifugal fan includes a curved span and one or more curved inboard edges that have an inner radius of approximately 25 mm.

14. The circuit board assembly of claim 12, wherein the plurality of blades consists of thirty-two blades.

15. The circuit board assembly of claim 1, further including a power connector coupled to the first side of the expansion card adjacent to an edge of the expansion card, the power connector having a plug retention mechanism disposed on the second side of the expansion card.

16. The circuit board assembly of claim 15, wherein the expansion card includes surfaces defining a connector opening and the plug retention mechanism includes a protrusion that extends into the connector opening.

17. The circuit board assembly of claim 1, further including:
   a card bracket coupled to the metallic duct, the card bracket having surfaces defining a longitudinal opening and surfaces defining a lateral opening; and
   an interlock disposed within the card bracket, the interlock having a first member extending through the longitudinal opening and a second member extending through the lateral opening.

18. The circuit board assembly of claim 17, further including a motherboard having a connection slot and a clip mounted adjacent to the connection slot, wherein the clip includes surfaces defining a clip aperture, and wherein if the expansion card is plugged into the connection slot, the first member of the interlock engages with the clip aperture.

19. The circuit board assembly of claim 18, further including a spring mechanism disposed within the card bracket and coupled to the interlock, wherein if the second member of the interlock is used to compress the spring mechanism, the first member of the interlock disengages with the clip aperture.

20. A circuit board assembly comprising:
an expansion card including a first side and a second side;
a first set of semiconductor packages coupled to the first side of the expansion card;
a second set of semiconductor packages coupled to the second side of the expansion card;
a primary clamp structure coupled to the first side of the expansion card;
a secondary clamp structure coupled to the second side of the expansion card, wherein the primary clamp structure includes a front edge surface that contacts a peripheral portion of the first side of the expansion card and clamps the expansion card between the secondary clamp structure and the primary clamp structures;
a first heat pipe coupled to the first side of the expansion card, the first heat pipe having a direct thermal connection with the primary clamp structure, wherein the secondary clamp structure includes a secondary plate having a direct thermal connection with one or more of the second set of semiconductor packages; and
a second heat pipe coupled to the second side of the expansion card, the second heat pipe having a direct thermal connection with the secondary plate, wherein the expansion card includes surfaces defining a pipe opening, and wherein the first and second heat pipes contact one another through the pipe opening.

21. The circuit board assembly of claim 20, wherein the secondary clamp structure includes a plate having a back surface, the circuit board assembly further including a fastening mechanism coupled to the plate and the primary clamp structure.

22. The circuit board assembly of claim 20, wherein the secondary clamp structure includes a back surface associated with a clamp slot and the front edge surface is associated with the claim slot.

23. The circuit board assembly of claim 20, wherein one or more of the first set of semiconductor packages are mounted via a ball grid array adjacent to a slot installation edge of the expansion card.

24. A circuit board assembly comprising:
an expansion card including a first side and a second side;
a first set of semiconductor packages coupled to the first side of the expansion card;
a metallic duct coupled to the first side of the expansion card, the metallic duct including one or more flange surfaces having a direct thermal connection with one or more of the first set of semiconductor packages;
a second set of semiconductor packages coupled to the second side of the expansion card; and
a motherboard having a connection slot and a clip mounted adjacent to the connection slot, wherein the clip includes surfaces defining a clip aperture, and wherein if the expansion card is plugged into the connection slot, the first member of the interlock engages with the clip aperture.

25. The circuit board assembly of claim 24, further including a spring mechanism disposed within the card bracket and coupled to the interlock, wherein if the second member of the interlock is used to compress the spring mechanism, the first member of the interlock disengages with the clip aperture.

* * * * *